(12) United States Patent
Arvin et al.

(10) Patent No.: US 8,450,619 B2
(45) Date of Patent: May 28, 2013

(54) CURRENT SPREADING IN ORGANIC SUBSTRATES

(75) Inventors: Charles L. Arvin, Poughkeepsie, NY (US); Raschid J. Bezama, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 648 days.

(21) Appl. No.: 12/683,867

(22) Filed: Jan. 7, 2010

(65) Prior Publication Data

US 2011/0162876 A1   Jul. 7, 2011

(51) Int. Cl.
  *H05K 7/10*   (2006.01)
(52) U.S. Cl.
  USPC ............................ 174/257; 361/760; 361/767
(58) Field of Classification Search
  USPC ............................ 174/257, 256; 361/767, 760
  See application file for complete search history.

(56) References Cited

U.S. PATENT DOCUMENTS

| 7,626,829 | B2 * | 12/2009 | Watanabe et al. | 361/767 |
| 7,738,258 | B2 * | 6/2010 | Ohno et al. | 361/767 |
| 8,013,256 | B2 * | 9/2011 | Nakai | 174/257 |
| 8,035,035 | B2 * | 10/2011 | Asano | 174/255 |
| 8,153,905 | B2 * | 4/2012 | Furuta et al. | 174/261 |
| 8,286,046 | B2 * | 10/2012 | Ong | 714/738 |
| 2005/0150683 | A1 * | 7/2005 | Farnworth et al. | 174/255 |
| 2009/0090543 | A1 * | 4/2009 | Furuyama et al. | 174/257 |
| 2009/0114431 | A1 * | 5/2009 | Kuroda et al. | 174/257 |
| 2009/0174045 | A1 | 7/2009 | Arvin et al. | |
| 2009/0290316 | A1 * | 11/2009 | Kariya | 361/767 |
| 2011/0083885 | A1 * | 4/2011 | Kim et al. | 174/257 |
| 2011/0120760 | A1 * | 5/2011 | Okada et al. | 174/257 |

OTHER PUBLICATIONS

U.S. Appl. No. 11/968,663, filed Jan. 3, 2008, Patent Application and Figures.
Ran, et al., Thermal Characterization of Copper Contact Interconnect for DRAM Package Stacking in Memory-Intensive Consumer Applications, Advanced Microelectronics, vol. 34, No. 6, Nov./Dec. 2007, pp. 10-14.

* cited by examiner

*Primary Examiner* — Chau Nguyen
*Assistant Examiner* — Kevin Ahlstrom
(74) *Attorney, Agent, or Firm* — Hoffman Warnick LLC; Wenjie Li

(57) ABSTRACT

Solutions for improving current spreading in organic substrates are disclosed. In one aspect, a packaging substrate is disclosed, the packaging substrate comprising: a substrate base having a first surface and a second surface; and a controlled collapse chip connect (C4) pad over a portion of the first surface, the C4 pad including: an electrolessly plated copper (Cu) layer over the first surface; an electrolytic nickel (Ni) portion over the first electrolytic Cu portion; and a first electrolytic Cu portion over the electrolytic Ni portion; wherein the electrolessly plated Cu layer has a portion extending in one direction away from the C4 pad.

20 Claims, 23 Drawing Sheets

CURRENT SPREADING IN ORGANIC SUBSTRATES

BACKGROUND OF THE INVENTION

The subject matter disclosed herein relates to solutions for improving current spreading in organic substrates. More specifically, the subject matter disclosed herein relates to distributing current at a metal-solder interface.

Once formation of semiconductor devices and interconnect structures on a semiconductor wafer (substrate) is complete, the semiconductor wafer is diced into semiconductor chips, or "dies." Semiconductor chips are then packaged to facilitate mounting on a circuit board. A "package" is a supporting element for the semiconductor chip that provides mechanical protection and electrical connection to a separate assembly system such as the circuit board. One form of packaging technology currently used is Controlled Collapse Chip Connection (C4) packaging, which employs C4 balls each of which contacts a C4 pad on the semiconductor chip and another C4 pad on a packaging substrate. These packaging substrates may help to provide an electrical link between the semiconductor chip and a system board of a computer.

However, C4 packaging poses reliability concerns because both C4 balls and C4 pads are susceptible to electromigration. Electromigration is the movement of a material due to gradual drifting of metal ions in a metallic conductor. As current flows through the metallic conductor, the electrons conducting that current transfer their momentum to the conductive material and may over time create a gap between the C4 pad and the C4 ball. This gap may adversely affect the performance of the semiconductor device.

BRIEF DESCRIPTION OF THE INVENTION

Solutions for improving current spreading in organic substrates are disclosed. In one aspect, a packaging substrate is disclosed, the packaging substrate comprising: a substrate base having a first surface and a second surface; and a controlled collapse chip connect (C4) pad over a portion of the first surface, the C4 pad including: an electrolessly plated copper (Cu) layer over the first surface; an electrolytic nickel (Ni) portion over the first electrolytic Cu portion; and a first electrolytic Cu portion over the electrolytic Ni portion; wherein the electrolessly plated Cu layer has a portion extending in one direction away from the C4 pad.

A first aspect of the invention provides a packaging substrate comprising: a substrate base having a first surface and a second surface; and a controlled collapse chip connect (C4) pad over a portion of the first surface, the C4 pad including: an electrolessly plated copper (Cu) layer over the first surface; an electrolytic nickel (Ni) portion over the first electrolytic Cu portion; and a first electrolytic Cu portion over the electrolytic Ni portion; wherein the electrolessly plated Cu layer has a portion extending in one direction away from the C4 pad.

A second aspect of the invention provides a packaging substrate comprising: a core having a first surface and a second surface; a first metal interconnect layer over the first surface of the core, the first metal interconnect layer including a first interconnect component and a first insulator material; a second metal interconnect layer over the second surface of the core, the second metal interconnect layer including a second interconnect component and a second insulator material; a controlled collapse chip connect (C4) pad over a first portion of the first metal interconnect layer, the C4 pad comprising an electrolessly plated copper (Cu) layer and an electrolytic Cu layer directly thereover; an extension region including portions of the electrolessly plated CU layer and the electrolytic Cu layer, the extension region extending in one direction away from the C4 pad; and a solder mask over a second portion of the first metal interconnect layer, the solder mask abutting a sidewall of the C4 pad.

A third aspect of the invention provides a method of forming a packaging substrate, the method comprising: forming a core; forming a first metal interconnect layer over the first surface of the core, the first metal interconnect layer including a first interconnect component and an insulator material; forming a second metal interconnect layer over the second surface of the core, the second metal interconnect layer including a second interconnect component and the insulator material; forming a controlled collapse chip connect (C4) pad over the first metal interconnect layer; forming an extension layer over the first metal interconnect layer extending away from the C4 pad; and forming a solder mask over a portion of the C4 pad.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As used herein, the term "deposition" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 1:
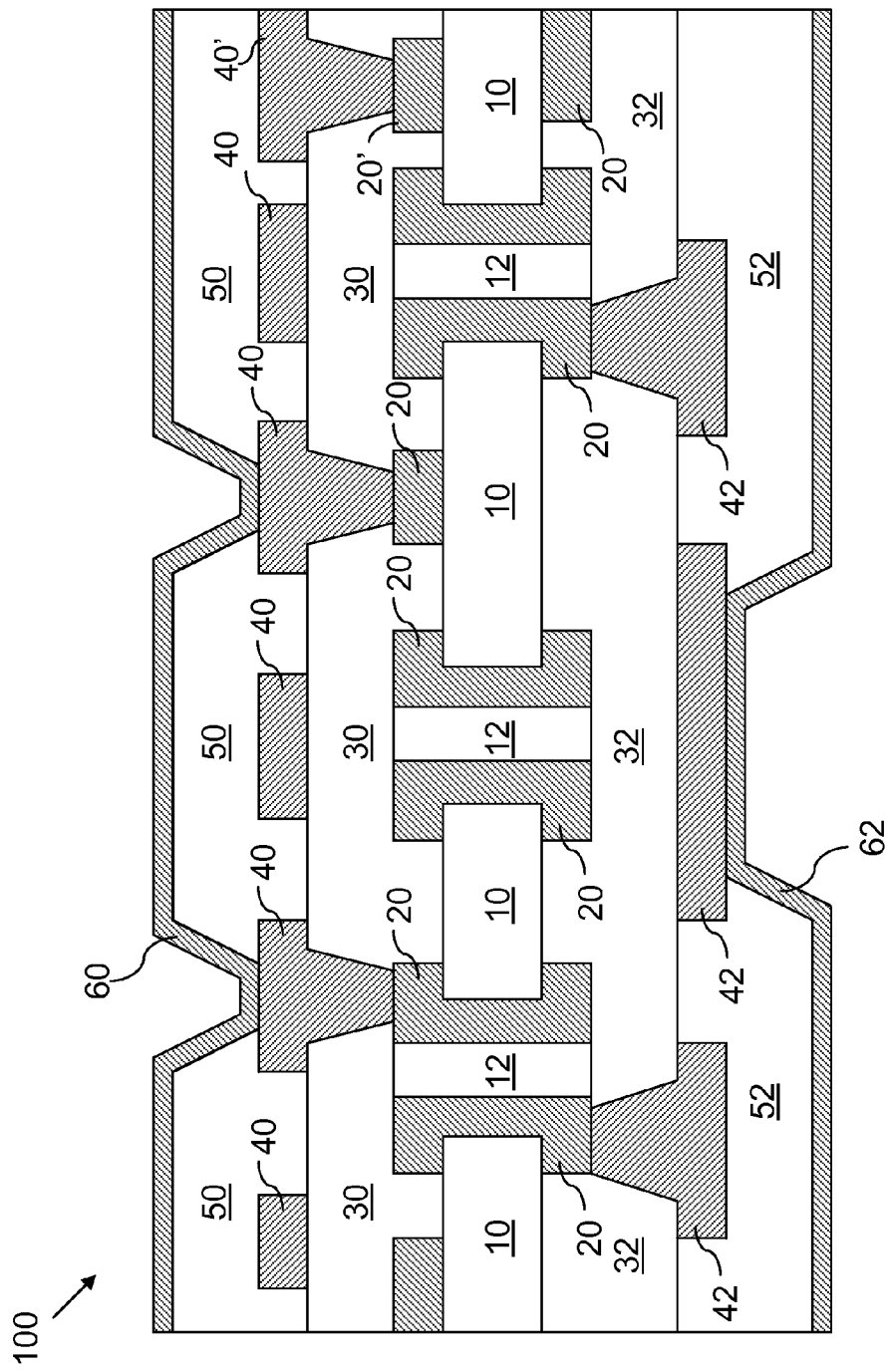
FIG. 1 shows a cross-sectional view of a prior art packaging substrate.

Turning to the figures, solutions for improving current spreading in organic substrates are disclosed. FIG. 1 shows a prior art packaging substrate including a core and interconnect layers, collectively referred to herein as a substrate base 100. Formation of substrate base 100 and its components are known in the art, as described, for example, in United States Patent Publication No. 20090174045, filed on 3 Jan. 2008. Substrate base 100 may include a core 10, through-core cylinders 12, core-level metal portions 20 (20'), a first inner insulator layer 30, a second inner insulator layer 32, first metal interconnect components 40 (and 40'), second metal interconnect components 42, a first outermost insulator layer 50, a second outermost insulator layer 52, a first core copper (Cu) layer 60 and a second core Cu layer 62. In one embodiment, first core Cu layer 60 and second core Cu layer 62 may be electrolessly plated copper layers. While shown and described herein as a substrate base 100 including the aforementioned components, substrate base 100 may include other conventional core or interconnect layers not listed herein. Other interconnect components, insulator layers and alternative materials used therein will be apparent to those skilled in the art. Further, substrate base 100 may be any substrate that allows for formation of a controlled collapse chip connection (C4) pad thereon.

Figure 2:
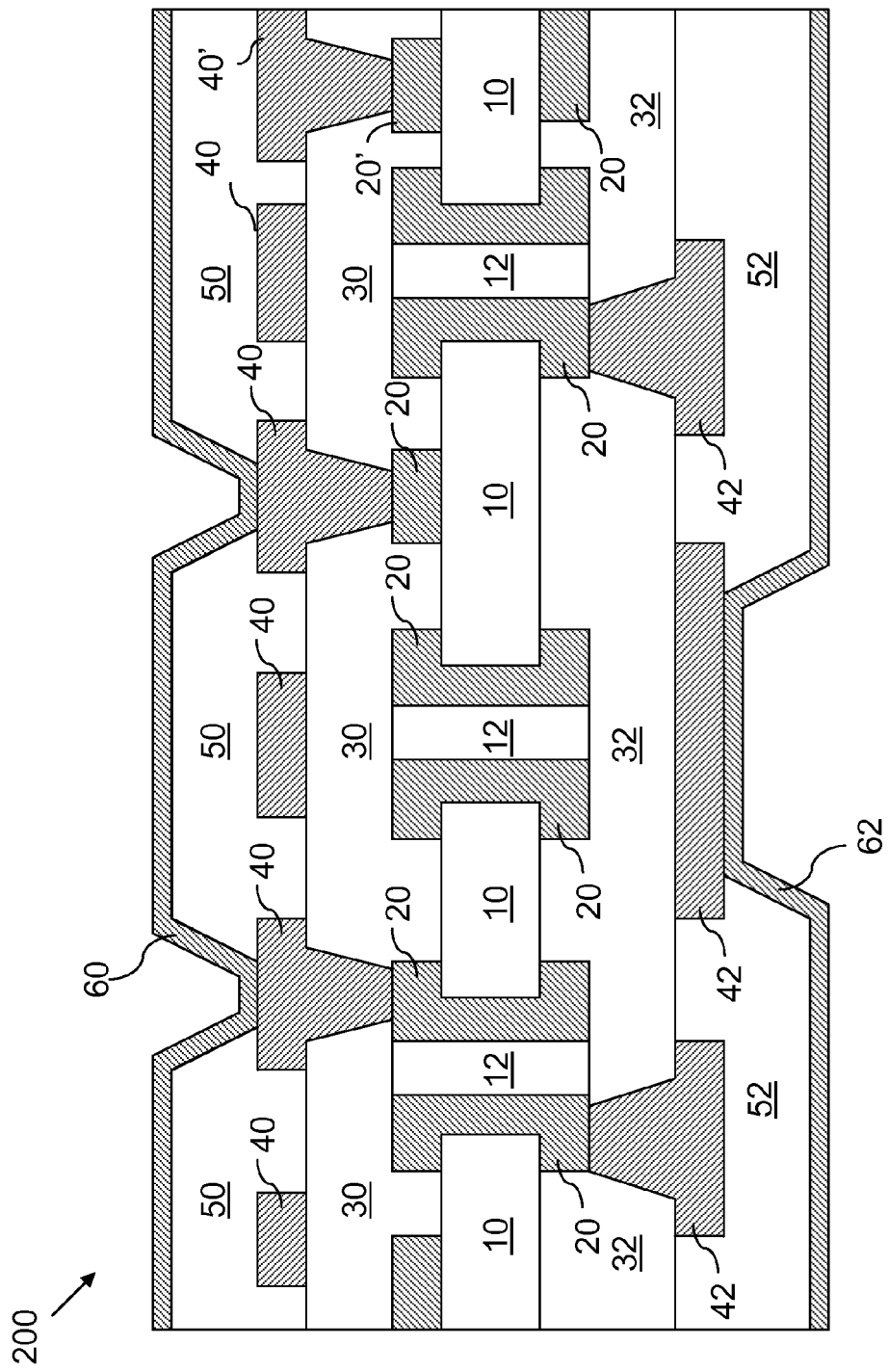
FIGS. 2-10 show cross-sectional views of steps in forming packaging substrates according to embodiments of the invention.

FIG. 2 shows a substrate base 200 according to embodiments of the invention. Substrate base 200 may be substantially similar to substrate base 100 of the prior art. However, in one embodiment (not shown), substrate base 200 may be formed without core-level metal portion 20' and first metal interconnect component 40' of substrate base 100. For illustrative purposes, core-level metal portion 20' and first metal interconnect component 40' are included in all the figures shown and described herein.

Figure 3:
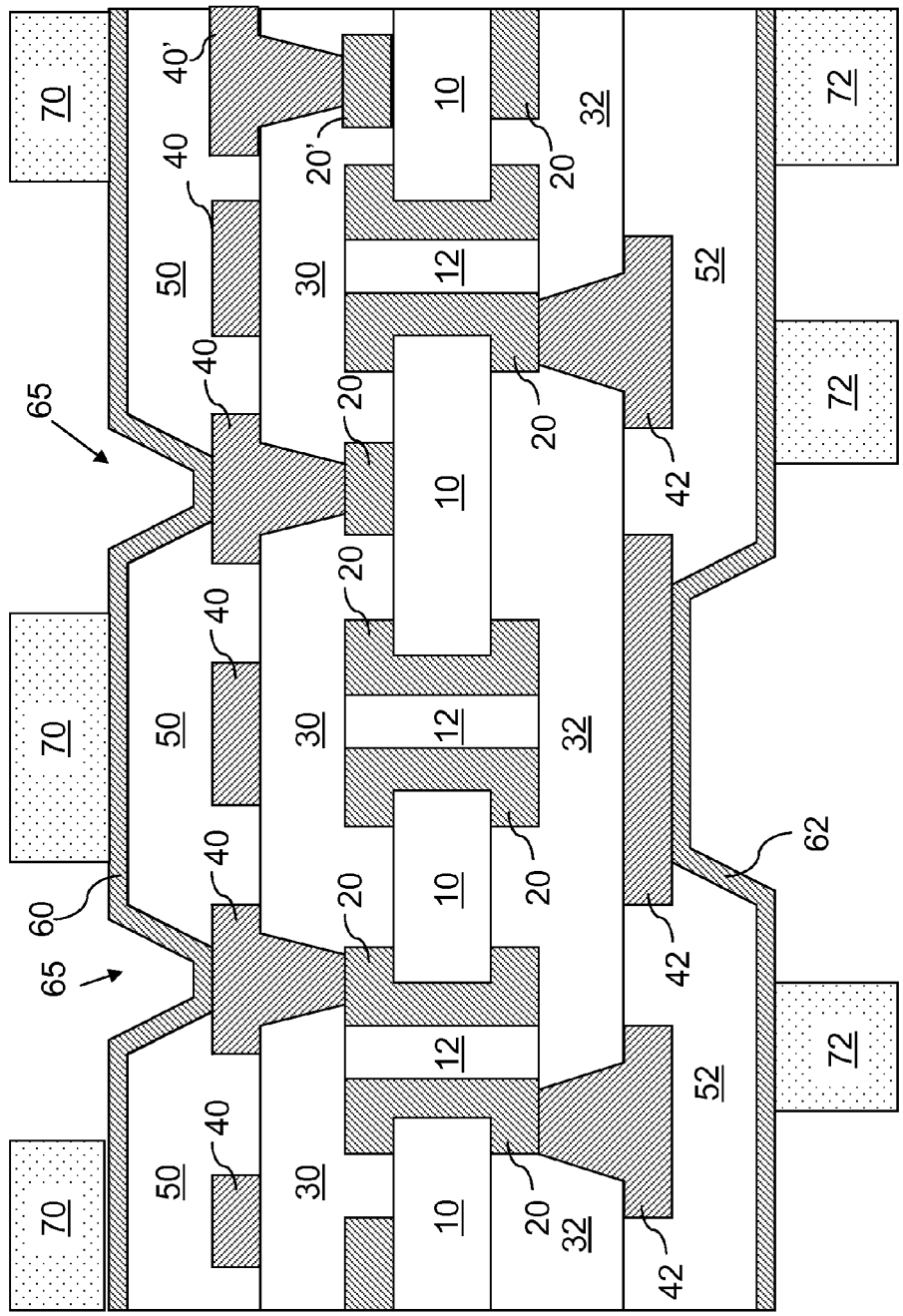

FIG. 3 shows a first step in forming a packaging substrate according to an embodiment of the invention. In FIG. 3, a first photoresist 70 and a second photoresist 72 are formed over the first core Cu layer 60 and second core Cu layer 62, respectively, of substrate base 200. First photoresist 70 may be selectively formed over portions of first core Cu layer 60, leaving other portions of first core Cu layer 60 exposed. These exposed portions of first core Cu layer 60 may be large enough to enable later forming of a C4 pad thereon, where the C4 pad may accommodate a C4 ball. Second photoresist 72 may be selectively formed over portions of second core Cu layer 62, leaving other portions of second core Cu layer 62 exposed. These exposed portions of second core Cu layer 62 may be large enough to enable later forming of a ball grid array (BGA) pad thereon, where the BGA pad may accommodate a BGA ball. First photoresist 70 and second photoresist 72 may, for example, be lithographically patterned over portions of first core Cu layer 60 and second core Cu layer 62, respectively. Also shown in FIG. 3 are two dimples 65, which may assist in subsequent forming of a portion of C4 pad (not shown).

Figure 4:
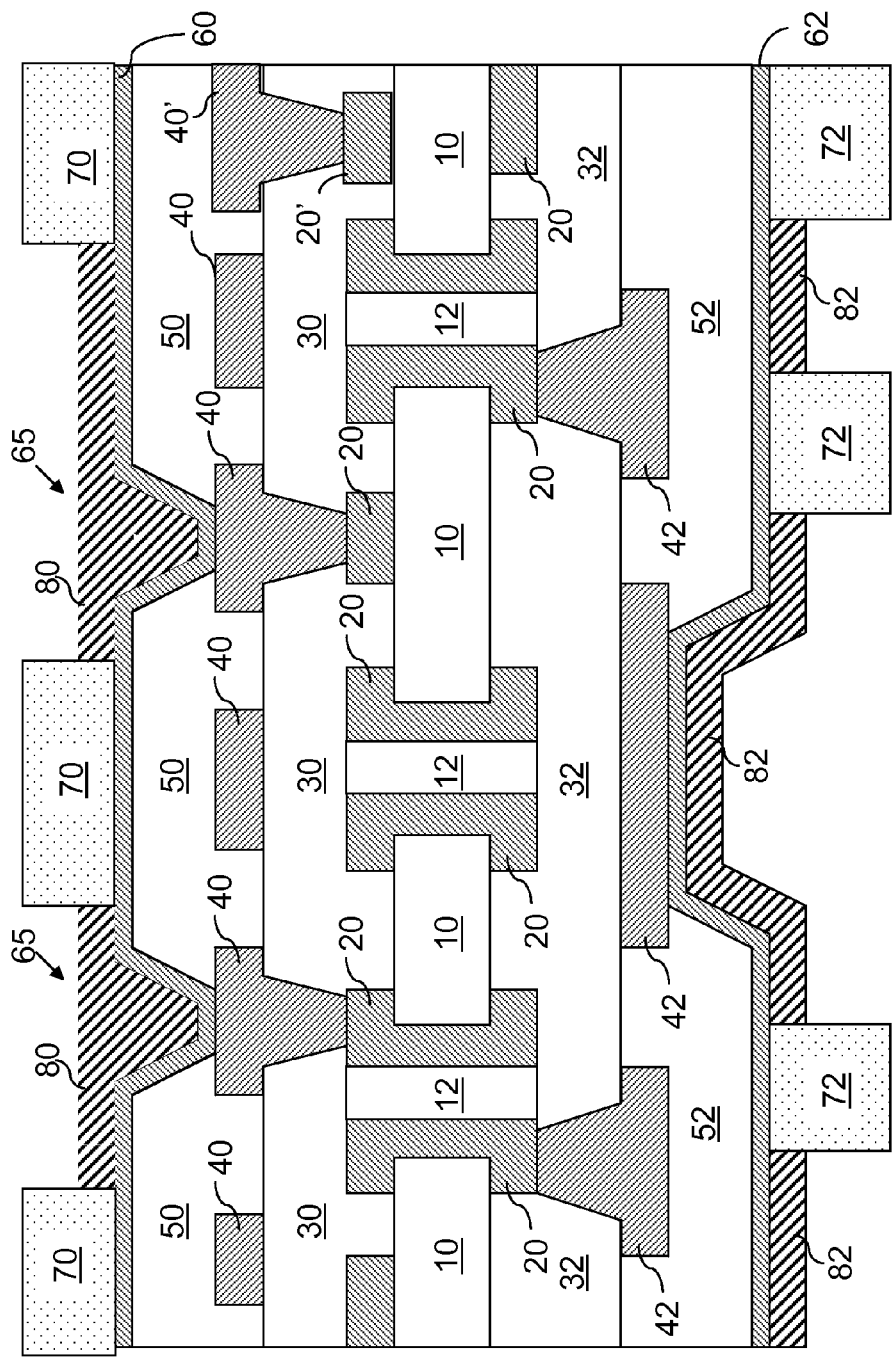

Turning to FIG. 4, a first copper (Cu) layer 80 and a second copper (Cu) layer 82 are formed on the exposed portions of first core Cu layer 60 and second core Cu layer 62, respectively. In one embodiment, first core Cu layer 60 and second core Cu layer 62 may be approximately 2 micrometers thick. This thickness, however, does not include the portions of first core Cu layer 60 which fill dimples 65 (FIG. 3). In the case that first core Cu layer 60 and second core Cu layer 62 are formed of electrolessly plated copper, first copper layer 80 and second copper layer 82 may be formed by electrolytic plating of copper on the exposed surfaces. As used from this point forward, and for ease of referencing, first copper layer 80 and second copper layer 82 will be referred to as "first electrolytic Cu layer 80" and second electrolytic Cu layer 82", respectively. First electrolytic copper layer 80 may be formed using a via fill bath, creating a substantially planar exposed surface of first electrolytic copper layer 80. That is, dimples 65 shown in first core Cu layer 60 of FIG. 3 may be substantially filled by first electrolytic copper layer 80.

It is understood that as used herein, terms such as "electrolytic copper", "electrolytic Cu layer", "electrolytic nickel (NI)", "electrolytic Ni layer", etc. may refer to layers including these elements. That is, these layers may include impurities or may be formed of various alloys of copper and/or nickel. For example, where an electrolytic Ni layer is described, that layer may alternatively be formed of an electrolytic nickel alloy such as, e.g., electrolytic nickel-cobalt (NiCo), electrolytic nickel-iron (NiFe), and/or other nickel alloys capable of acting as a barrier layer (e.g., preventing degradation of an underlying structure). Similarly, where an electrolytic Cu layer is described, that layer may alternatively be formed of any copper alloy capable of performing the functions described herein (e.g., acting as a wetting layer).

Figure 5:
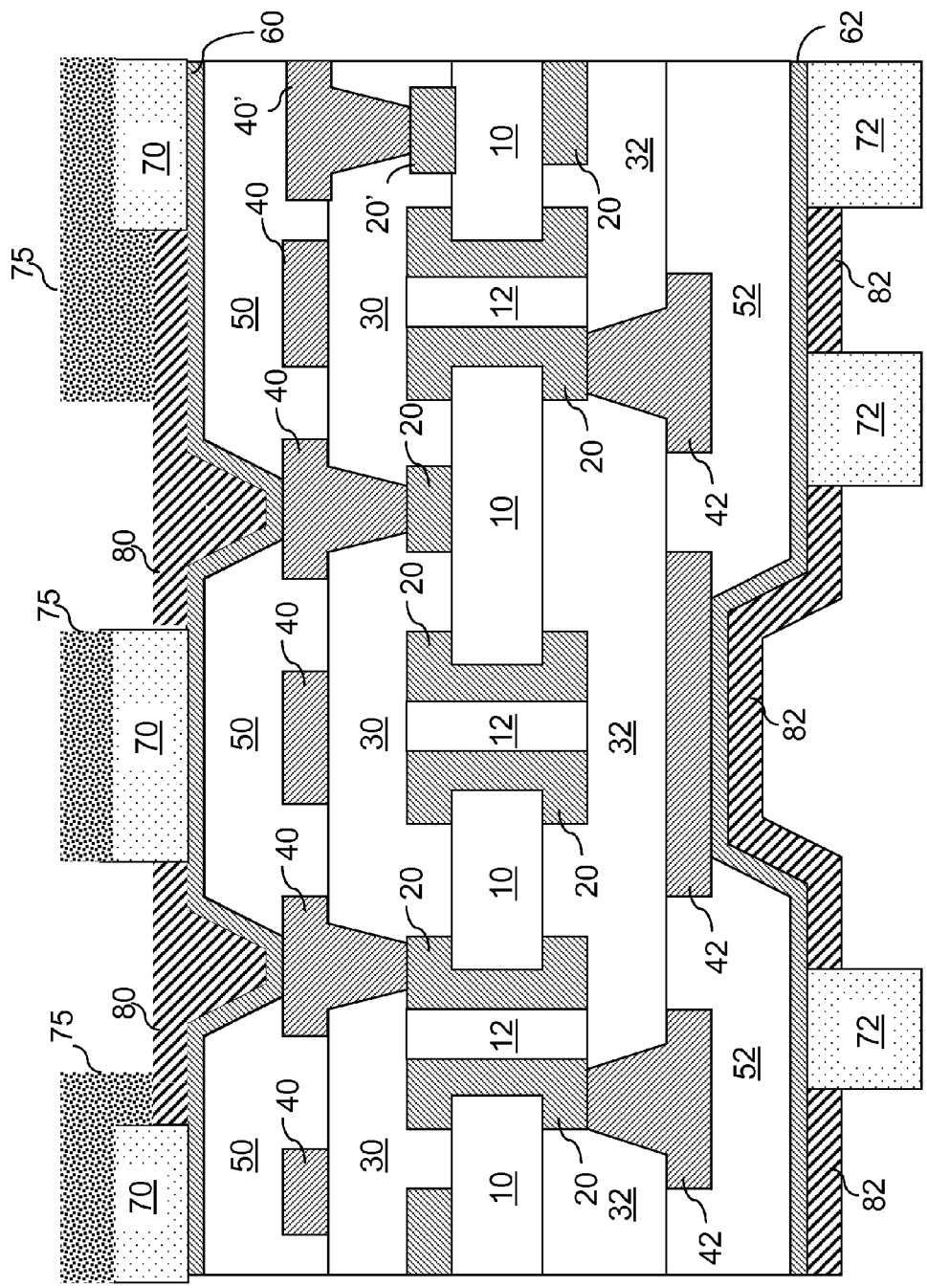

Turning to FIG. 5, a third photoresist 75 is formed over portions of first electrolytic copper layer 80 and first photoresist 70. Third photoresist 75 may be formed of substantially similar photoresist material as first photoresist 70, or may be formed of other conventional photoresist materials known in the art. Third photoresist 75 is selectively formed such that it covers portions of first electrolytic copper layer 80, while leaving other portions of first electrolytic copper layer 80 exposed for subsequent forming of a C4 pad (not shown).

Figure 6:
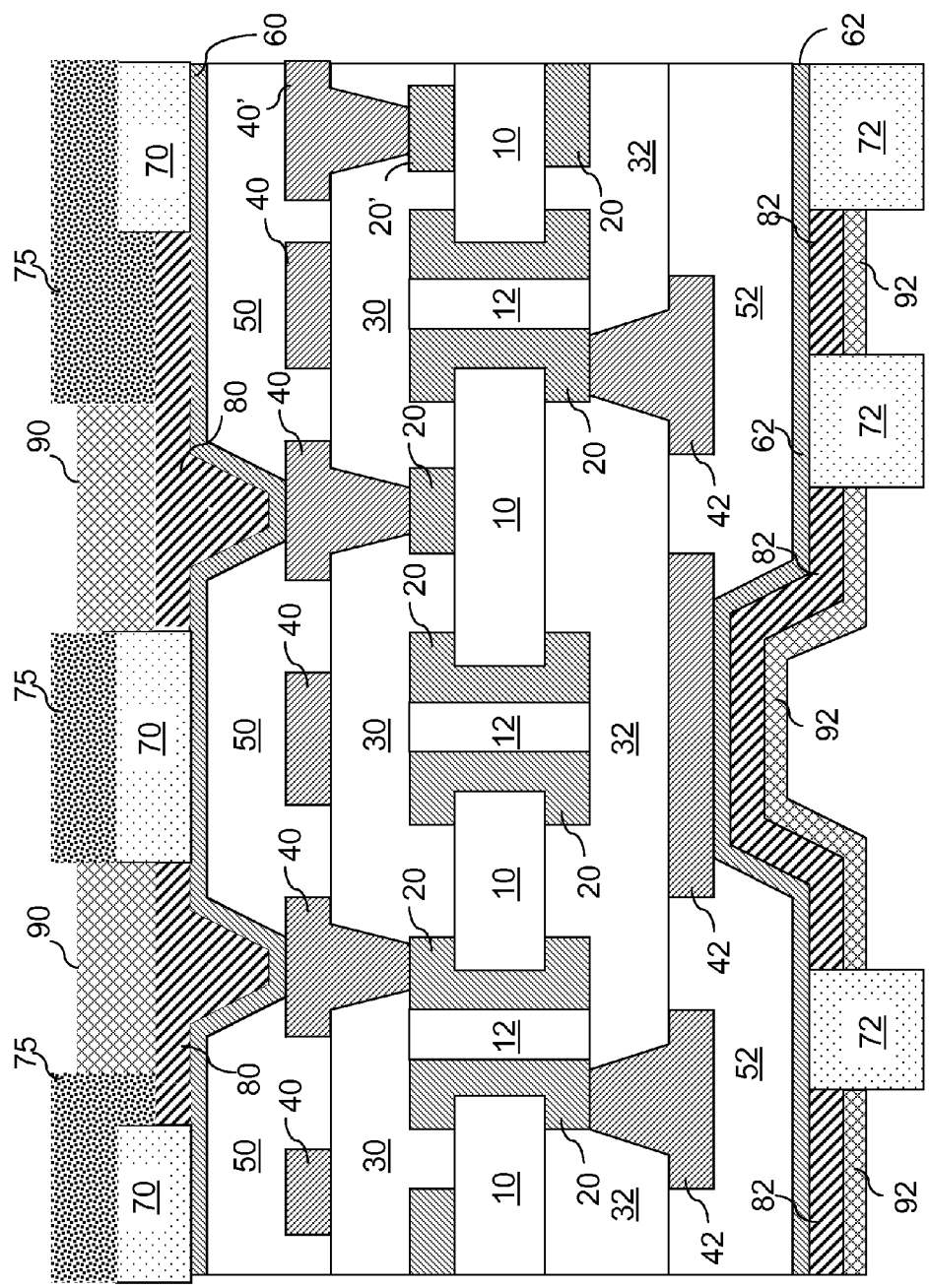

Turning to FIG. 6, a first nickel (Ni) layer 90 and a second Ni layer 92 are formed over the exposed portions of first electrolytic copper layer 80 and second electrolytic copper layer 82, respectively. First Ni layer 90 and second Ni layer 92 may be formed, for example, by electrolytic plating of nickel over the exposed portions of first and second electrolytic copper layers 80, 82. In one embodiment, first Ni layer 90 is approximately 10 micrometers thick, which may allow for increased current spreading through the C4 pad, which is further explained with reference to later processing steps and subsequent figures. Third photoresist 75 may define the area in which first Ni layer 90 is formed over first electrolytic copper layer 80, and second photoresist 72 may define the area in which second Ni layer 90 is formed over second electrolytic copper layer 82.

Figure 7:
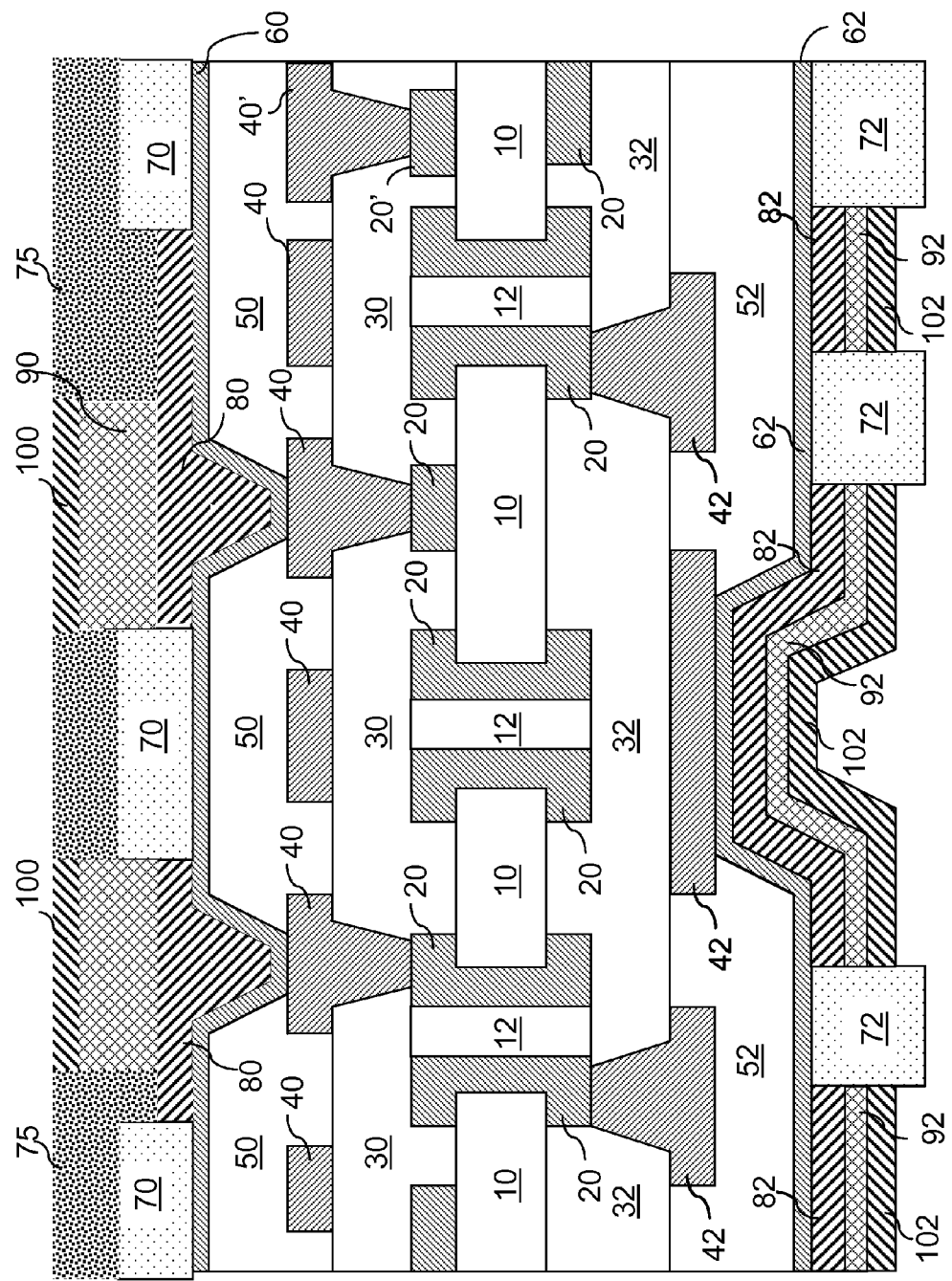

Turning to FIG. 7, a third copper (Cu) layer 100 and fourth Cu layer 102 are formed over the exposed portions of first and second Ni layer 90 and 92, respectively. Third Cu layer 100 and fourth Cu layer 102 may be formed, for example, of electrolytic plated copper. In one embodiment, third Cu layer 100 and fourth Cu layer 102 may be formed in a substantially similar fashion as first electrolytic Cu layer 80 and second electrolytic Cu layer 82. In one embodiment, third Cu layer 100 and fourth Cu layer 102 may be approximately 2 micrometers thick. As used herein, third Cu layer 100 and fourth Cu layer 102 are referred to as third electrolytic Cu layer 100 and fourth electrolytic Cu layer 102, respectively.

Figure 8:
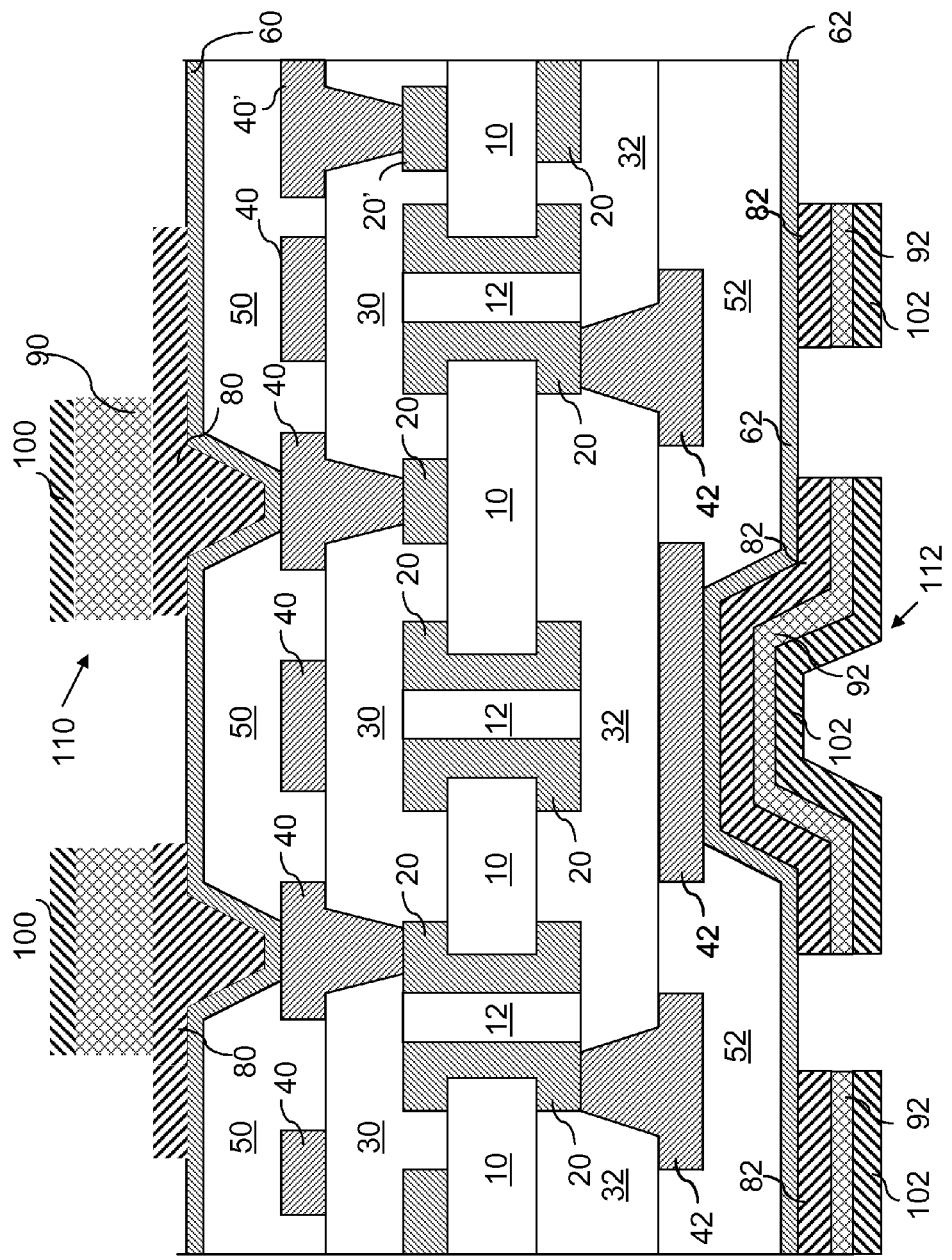

Turning to FIG. 8, first photoresist 70, second photoresist 72, and third photoresist 75 are removed using any conventional techniques such as, for example etching (e.g., using plasma) or a chemical bath. Third photoresist 75 may be removed in a separate processing step than removal of first photoresist 70 and second photoresist 72, however, separate processing steps may not be necessary. In any case, removal of first photoresist 70 and third photoresist 75 exposes, from a top view (not shown), portions of first core Cu layer 60, first electrolytic Cu layer 80, and third electrolytic Cu layer 100. In particular, portions of first electrolytic Cu layer 80 are exposed extending away from the C4 pad 110 (60, 80, 90, 100 stack structure). In this case, the exposed extensions of first electrolytic Cu layer 80 may extend away from each other. These exposed portions of electrolytic Cu layer 80 may allow for electrical current to spread before reaching the solder-C4 interface, which is further described in subsequent portions of this disclosure.

Figure 9:
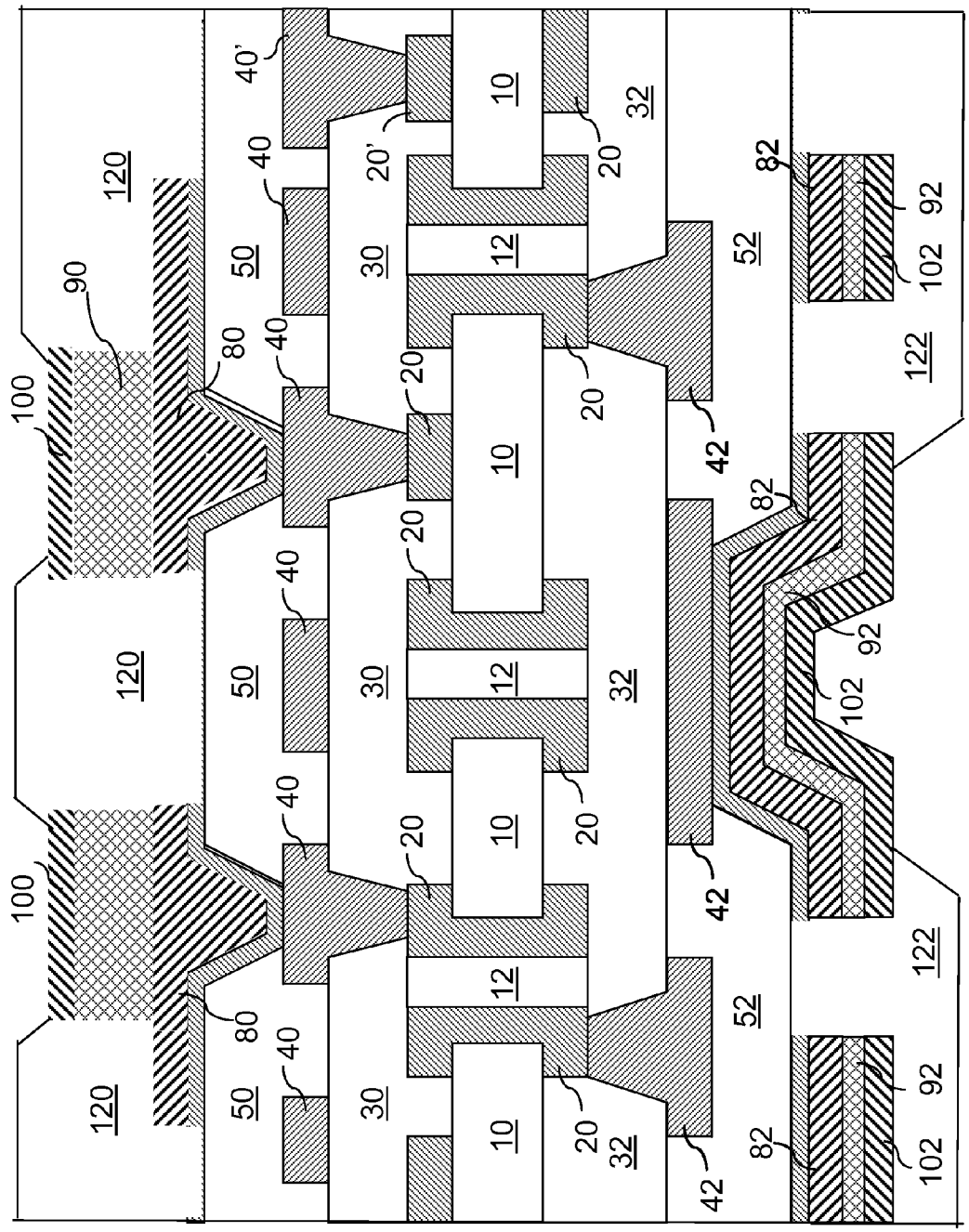

Turning to FIG. 9, exposed portions of first core Cu layer 60 and second core Cu layer 62 are removed using any traditional etching techniques known in the art. Following removal of portions of first core Cu layer 60 and second core Cu layer 62, a first solder mask 120 and second solder mask 122 are formed over portions of at least one C4 pad 110 (60, 80, 90, 100) and at least one BGA pad 112 (62, 82, 92, 102). First solder mask 120 and second solder mask 122 may be formed of any conventional solder mask material known in the art, for example, a photosensitive polyimide. It is noted that first Ni layer 90 and second Ni layer 92 do not form adhesive surfaces for first solder mask 120 and second solder mask 122. As such, third electrolytic Cu layer 100 and fourth electrolytic Cu layer 102 allow for adhesion of first solder mask 120 to C4 pad, and second solder mask 122 to BGA pad, respectively. It is understood that formation of third electrolytic Cu layer 100 below an upper surface of first solder mask 120 may allow for formation of a solder paste (e.g., a tin-silver-copper alloy or a tin-copper alloy) over third electrolytic Cu layer 100. This solder paste (not shown) may be used in later bonding of the C4 pad to a die (not shown). It is further understood that the formation of third electrolytic Cu layer 100 above an upper surface of first solder mask 120 (as in FIG. 10), may not allow for formation of the solder paste. In this case, bonding of the C4 pad may be performed using a material (e.g., solder) from the die.

Figure 10:
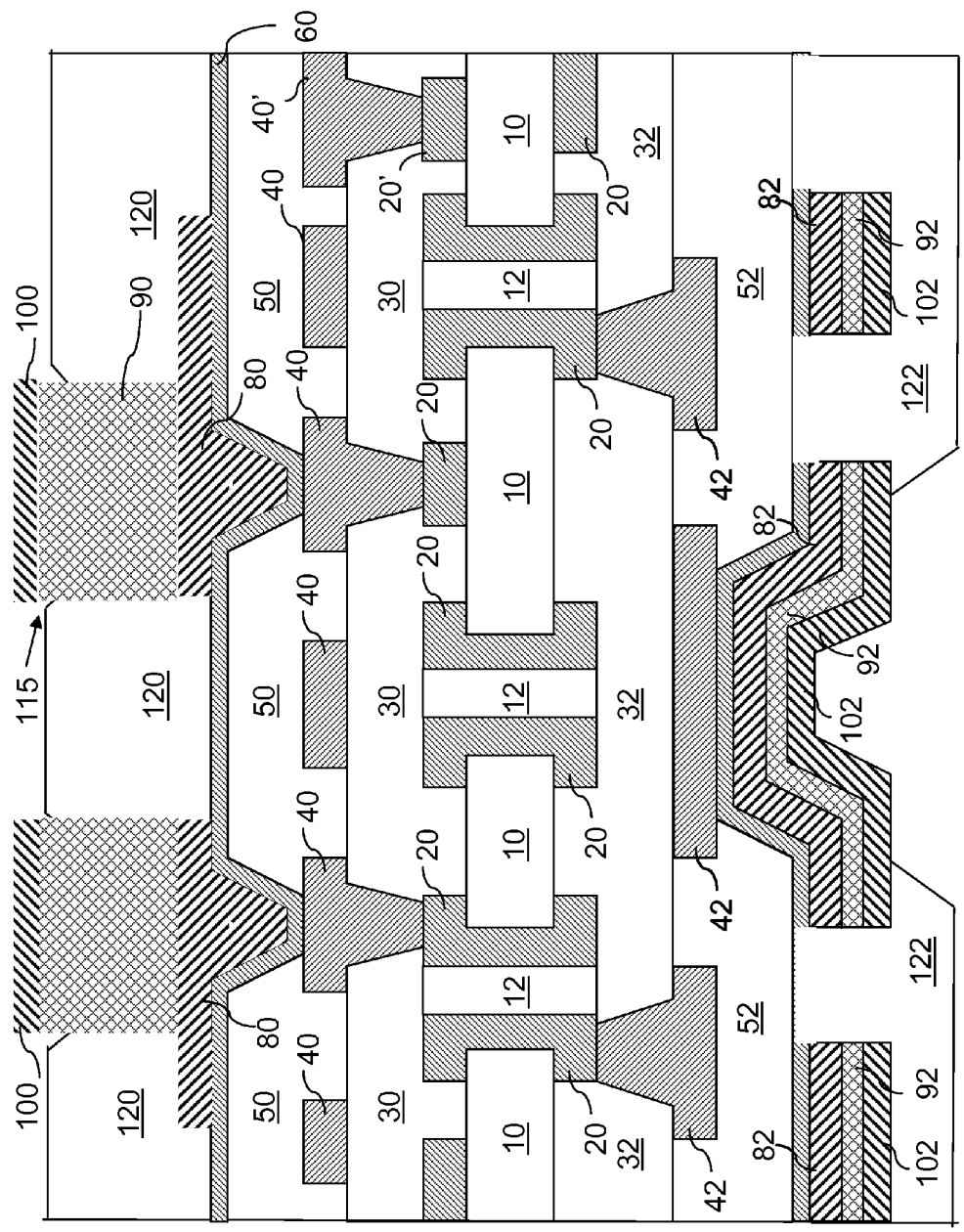

FIG. 10 shows a similar structure to that shown and described in FIG. 9, but with a thicker first Ni layer 90. As shown in FIG. 10, first Ni layer 90 is approximately 30 micrometers thick, allowing C4 pad to extend beyond a surface of first solder mask 120. This structure allows for additional current spreading through C4 pad, however, it requires a thicker third photoresist 75 (FIG. 6) to allow for formation of the thicker first Ni layer 90. Subsequent steps in forming the structure of FIG. 10 are substantially similar to those shown and described with reference to FIGS. 7-10. In any case, the structure of FIG. 10 may assist in current spreading through a thicker C4 pad 115 than that shown in FIG. 9 (110), and specifically, through a thicker first Ni layer 90.

Figure 11:
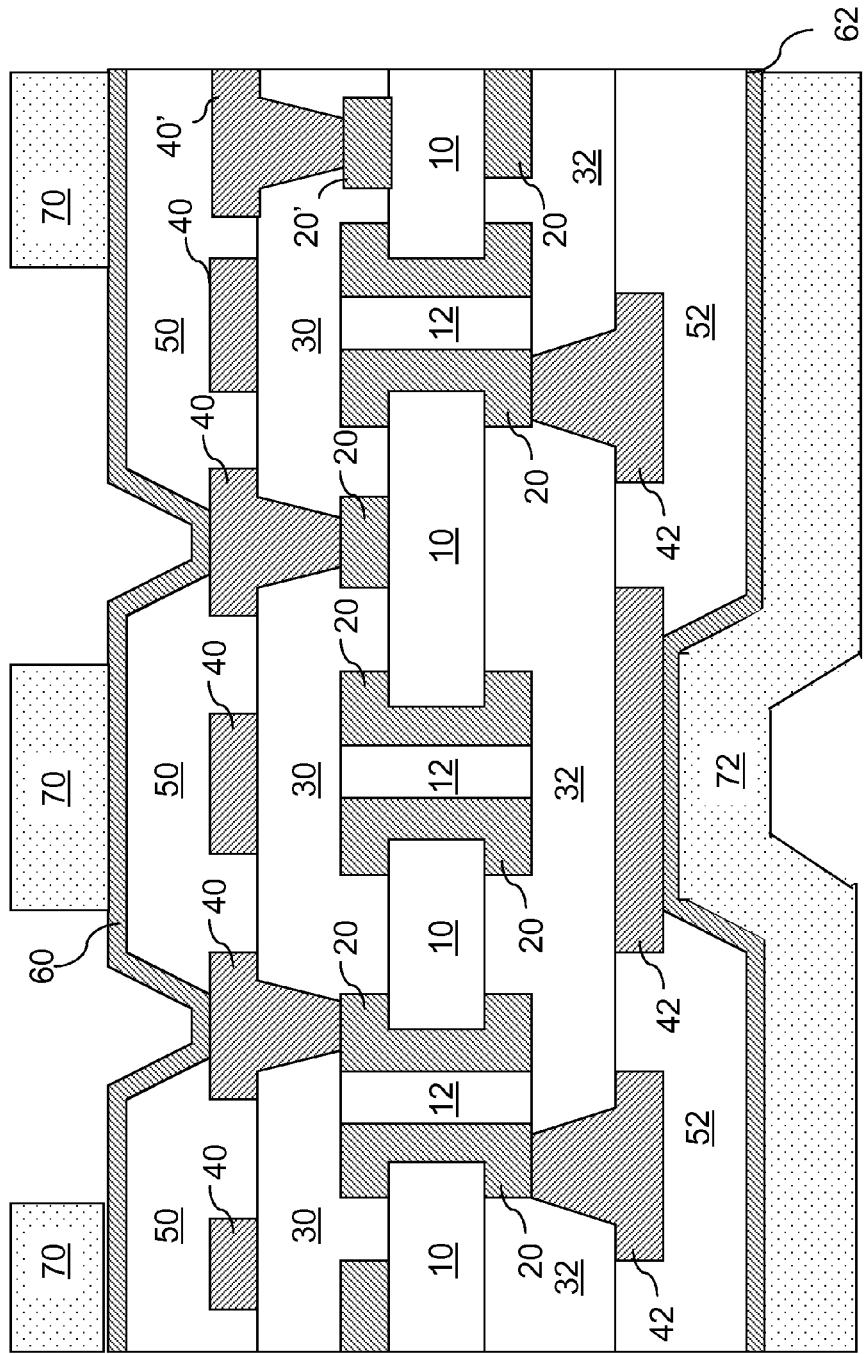
FIGS. 11-19 show cross-sectional views of steps in forming a packaging substrate according to another embodiment of the invention.

Turning to FIGS. 11-20, steps in forming an alternative current spreading structure are shown. FIG. 11 shows a substantially similar structure to that shown and described with reference to FIG. 3. Formation of the structure shown in FIG. 11 may be performed in a substantially similar manner as shown and described with reference to FIGS. 2-3. It is understood that FIGS. 11-21 illustrate steps in forming a current spreading structure according to embodiments of the invention. For illustrative purposes, formation of current spreading structures is shown in subsequent figures only on the C4 pad side (e.g., layers over first core Cu layer 60). It is understood that similar forming steps may be applied on the BGA pad side of the structures (e.g., over second core Cu layer 62), or that BGA pad side may remain as shown in FIG. 11. In another embodiment, the BGA pad side of structures shown herein may be covered substantially by a second photoresist 72. Second photoresist 72 may be substantially similar to any photoresist shown or described herein. For the purposes of clarity, second photoresist 72 is shown as formed over second core Cu layer 62 in FIGS. 11-23.

Figure 12:
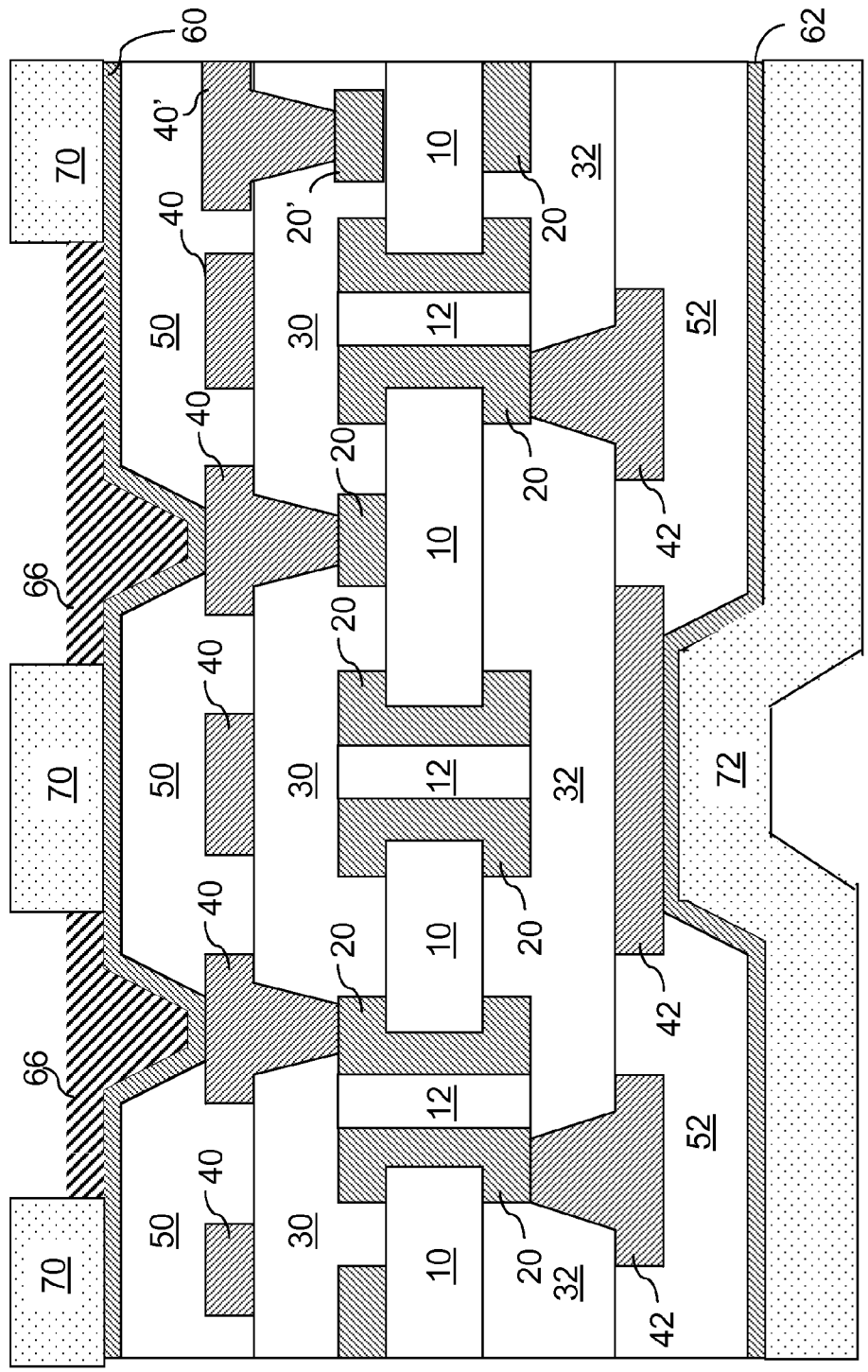

FIG. 12 shows deposition of a third Cu layer 66 over first core Cu layer 60 (FIG. 3). In one embodiment, third Cu layer 66 may be, for example, an electrolytic copper layer similar to first core Cu layer 60. In this case, third Cu layer 66 may be formed over first core Cu layer 60, for example, using a via fill bath, creating a substantially planar exposed surface of third Cu layer 66. Third Cu layer 66 may be formed over exposed portions of first core Cu layer 60, and between portions of first photoresist 70

Figure 13:
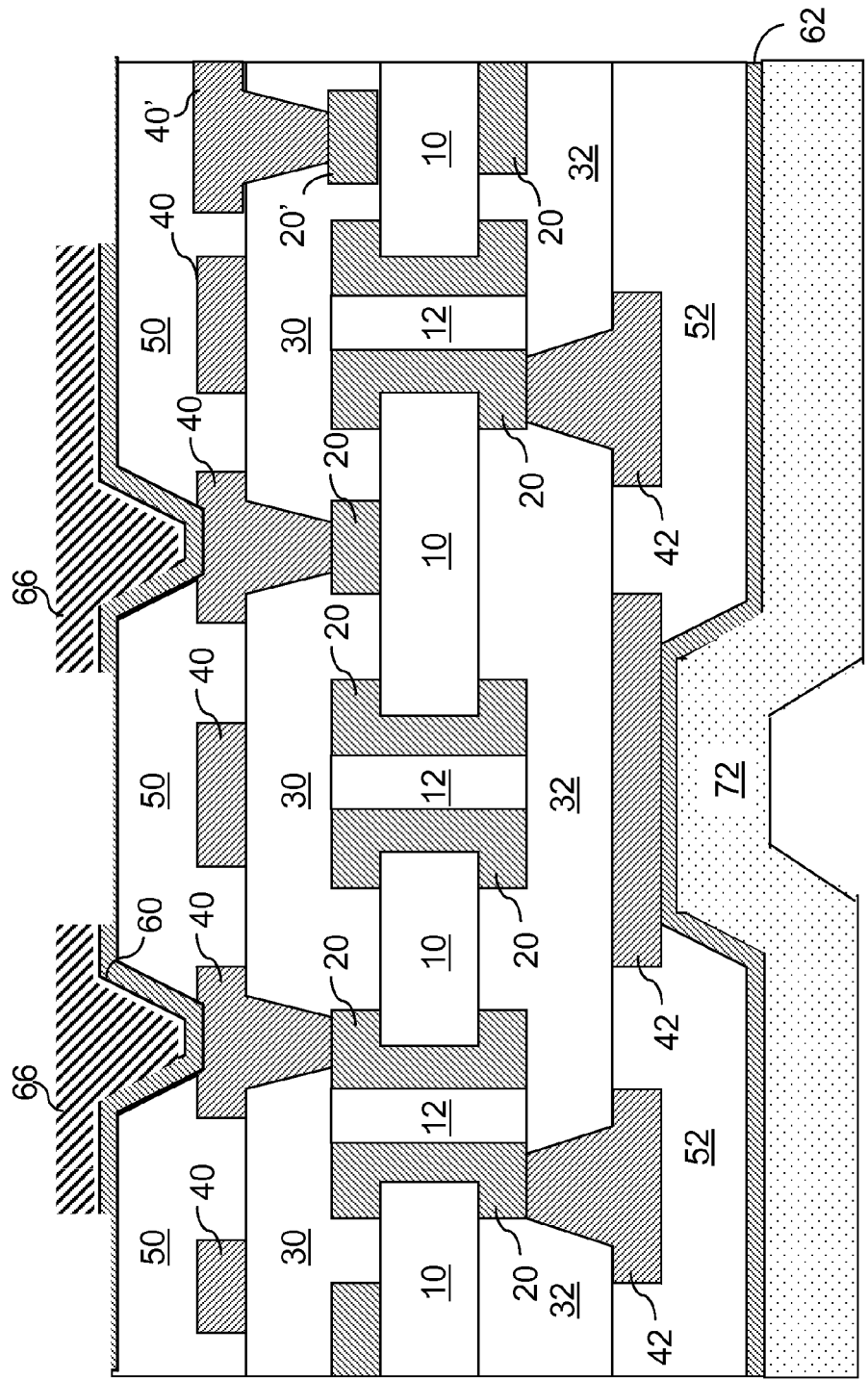

Turning to FIG. 13, first photoresist 70 and portions of first core Cu layer 60 have been selectively etched such that only portions of first core Cu layer 60 underlying third Cu layer 66 remain. Selective etching of first photoresist 70 and portions of first core Cu layer 60 may be performed in any conventional manner described herein or known in the art.

Figure 14:
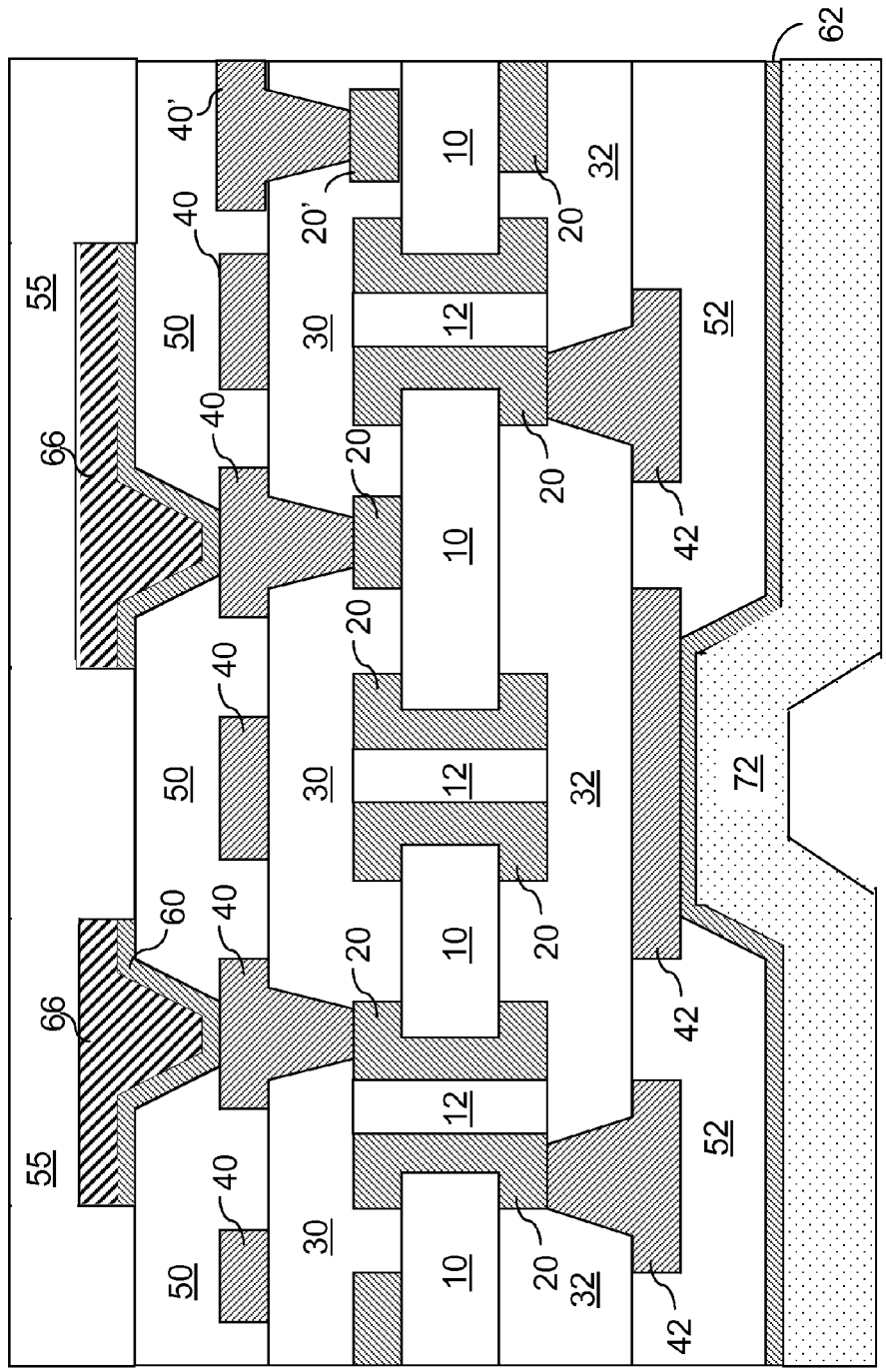

FIG. 14 shows deposition of a dielectric layer 55 over exposed portions of first outermost insulator layer 50 (surface of substrate base), first core Cu layer 60, and third Cu layer 66. Dielectric layer 55 may be formed of any dielectric material known in the art or described herein, and may be formed in any manner known herein or described in the art. For example, dielectric layer 55 may include silicon and/or germanium, and may be deposited over portions of first outermost insulator layer 50, first core Cu layer 60, and third Cu layer 66.

Figure 15:
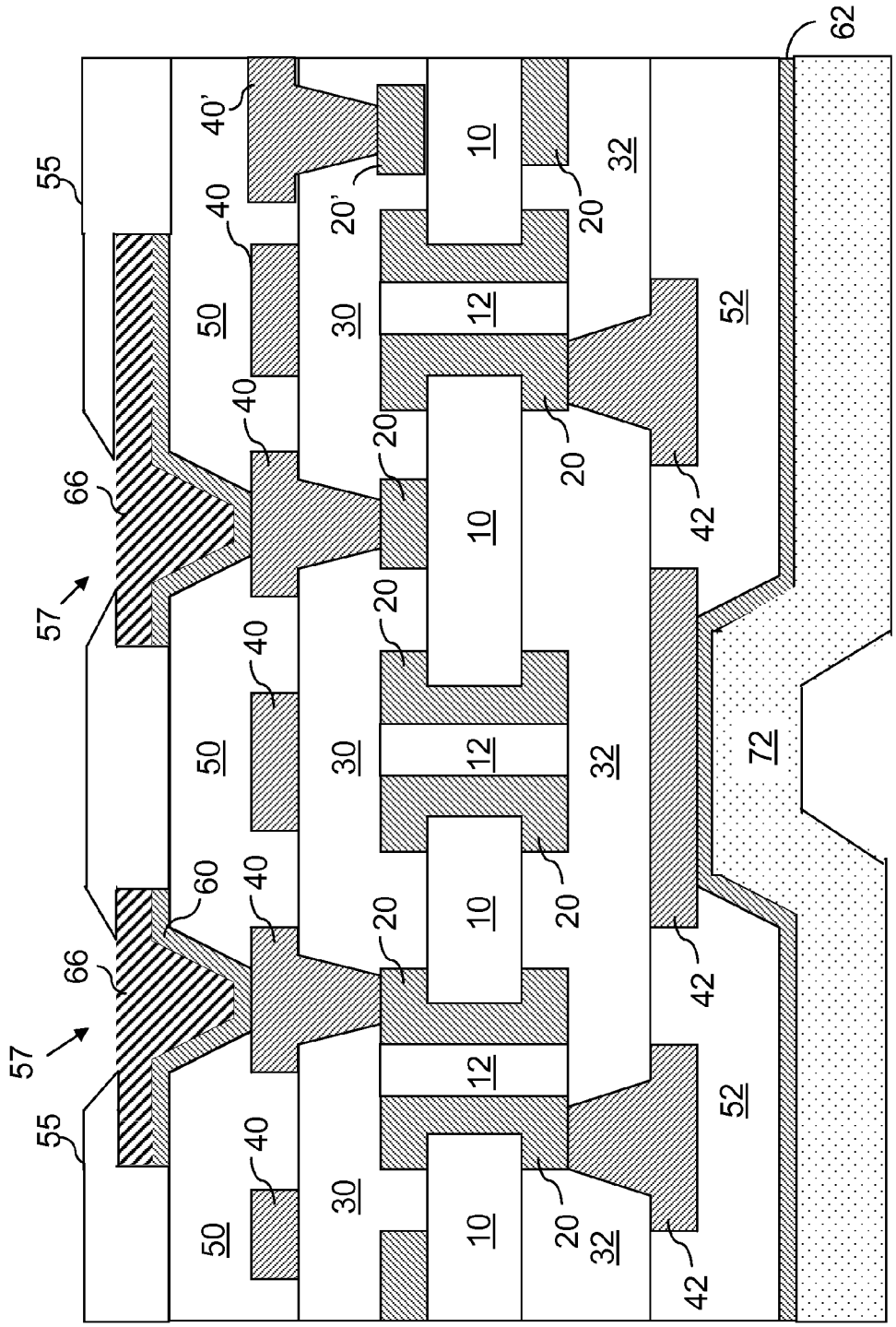

FIG. 15 shows selective removal of a dielectric layer 55 over portions third Cu layer 66. As shown, dielectric layer 55 has been removed to provide tapered openings 57 exposing portions of third Cu layer 66. Removal of dielectric layer 55 may be performed, for example, by laser cutting to form tapered openings 57. Tapered openings 57 may provide for later forming of a tapered via (not shown).

Figure 16:
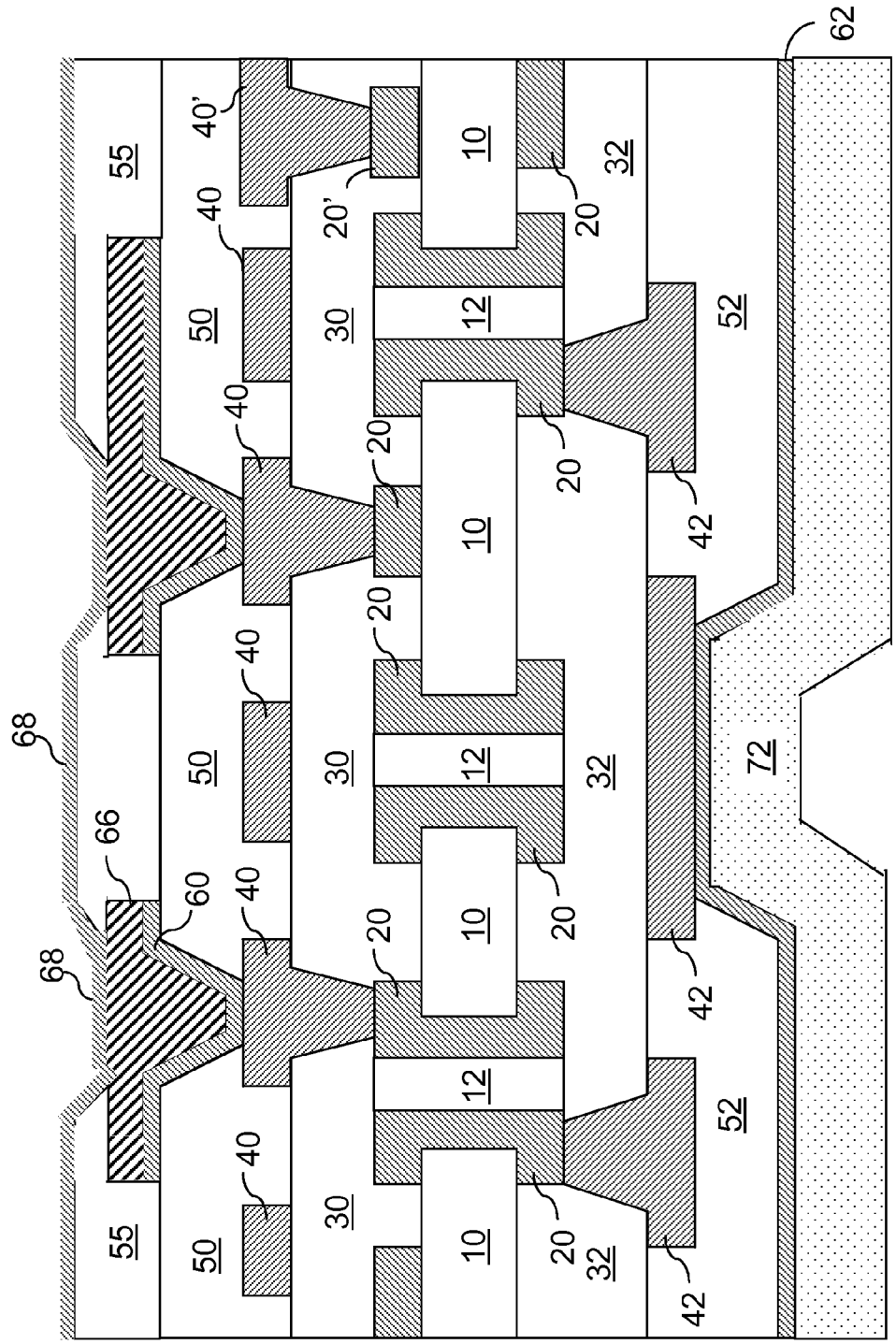

Turning to FIG. 16, a fourth Cu layer 68 is shown deposited over third Cu layer 66 and dielectric layer 55. Fourth Cu layer 68 may be, for example, an electrolessly plated copper layer and may be deposited in a similar fashion as first core Cu layer 60. Fourth Cu layer 68 may be electrolessly deposited as a thin film, coating underlying portions of third Cu layer 66 and dielectric layer 55.

Figure 17:
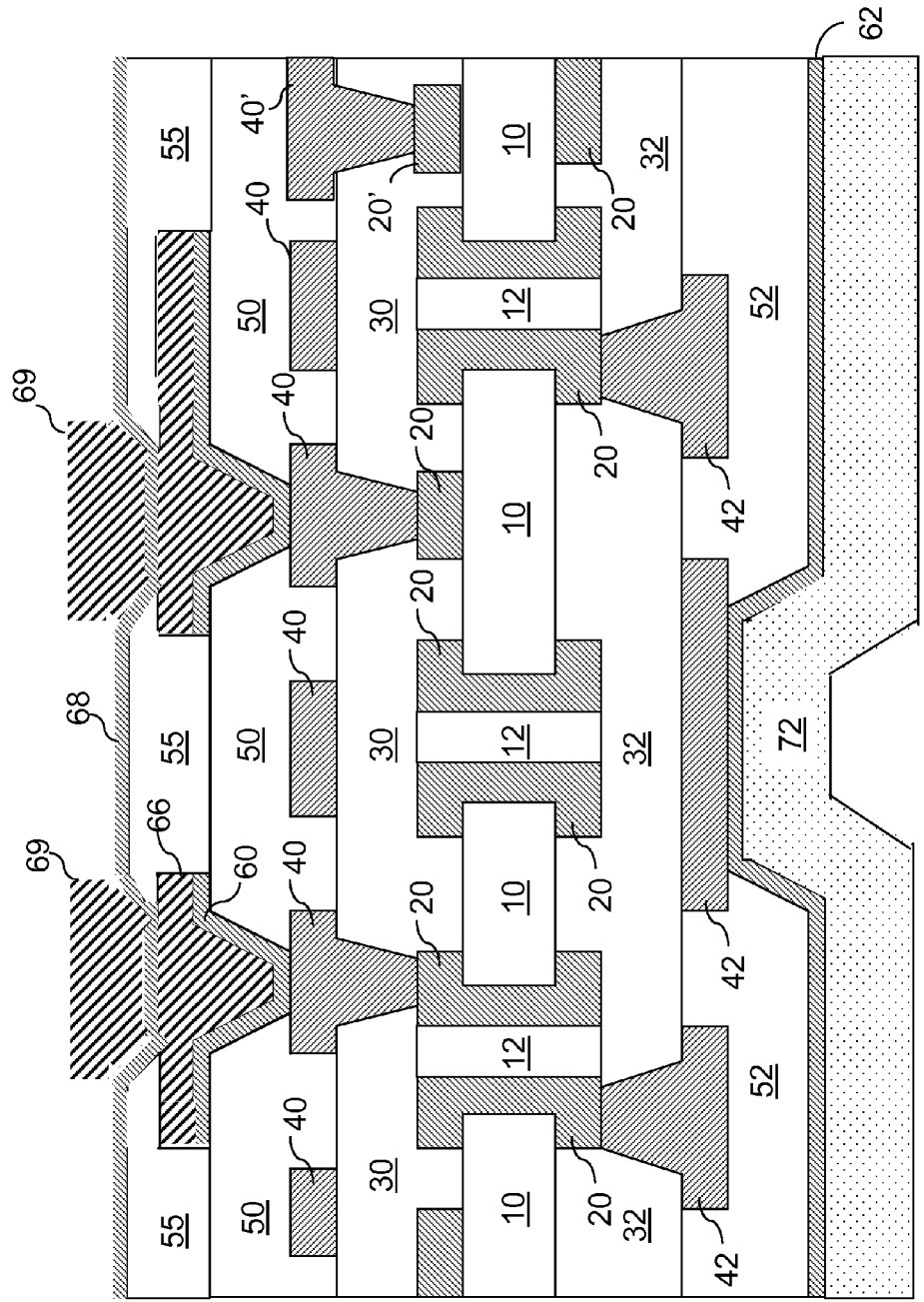

Turning to FIG. 17, a fifth Cu layer 69 is shown deposited over portions of fourth Cu layer 68. Fifth Cu layer 69 may be an electrolytic copper layer such as those shown and described herein (e.g., third Cu layer 66), and may be deposited using a mask (not shown) similar to any mask described herein and/or known in the art. Where fifth Cu layer 69 is an electrolytic copper layer, it may fill the remaining portions of tapered openings 57 (FIG. 15) not filled by fourth Cu layer 68. After electrolytic deposition of fifth Cu layer 69, the photomask may be removed to reveal the semiconductor structure shown in FIG. 17.

Figure 18:
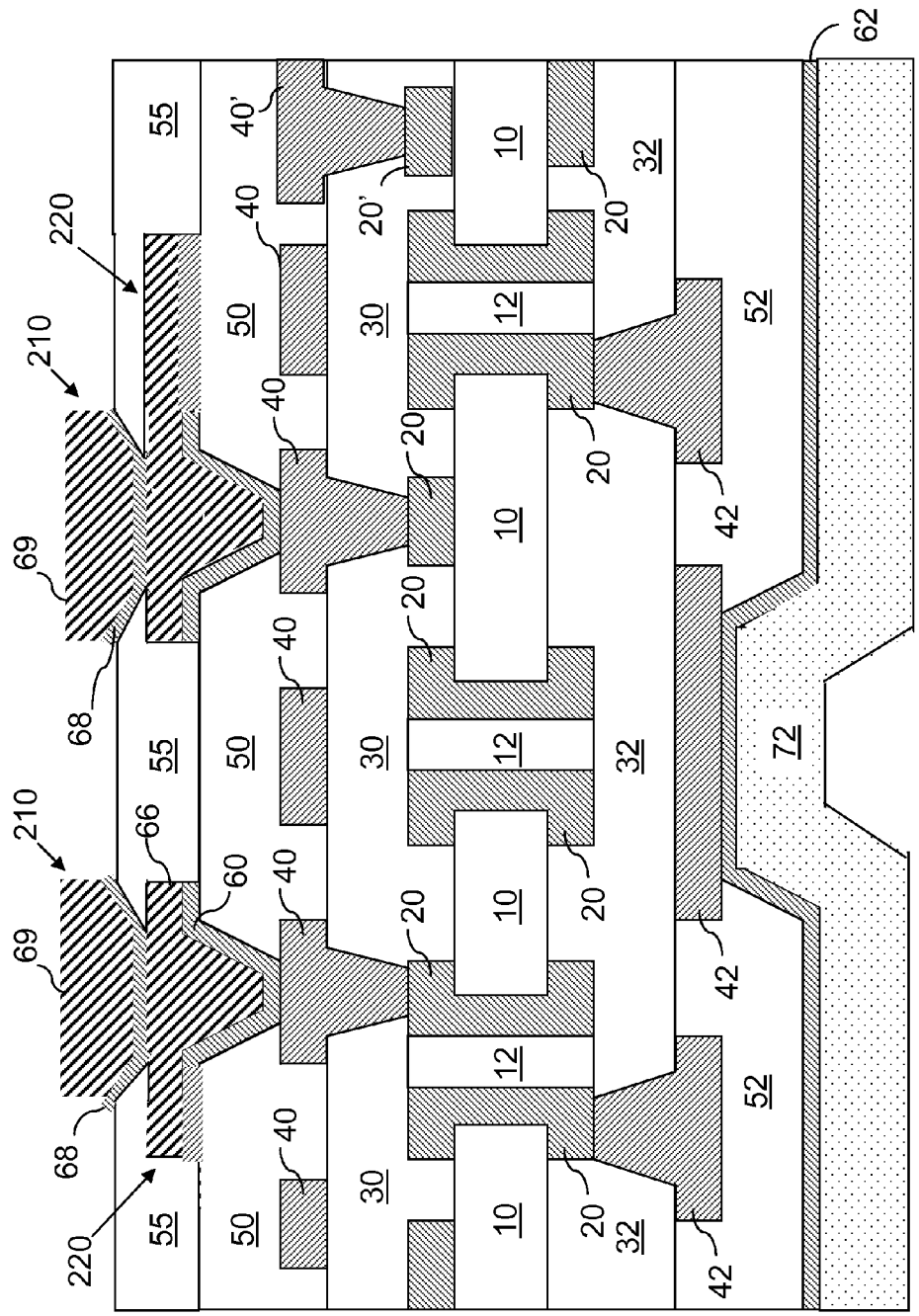

Turning to FIG. 18, portions of fourth Cu layer 68 overlying dielectric layer 55 have been removed. Portions of fourth Cu layer 68 may be removed using any conventional methods including, e.g., etching. Removal of portions of fourth Cu layer 68 may keep fifth Cu layer 69 substantially in tact. Remaining portions of fifth Cu layer 69, fourth Cu layer 68, third Cu layer 66, and first core Cu layer 60 form a C4 pad 210. C4 pad 210 may allow for later connection of the semiconductor structure to, e.g., a die. Extending from C4 pad 210 is extension 220. Extension 220 may include portions of first core Cu layer 60 and third Cu layer 66. Extension 220 may provide for, among other things, greater current spreading through C4 pad 210.

Figure 19:
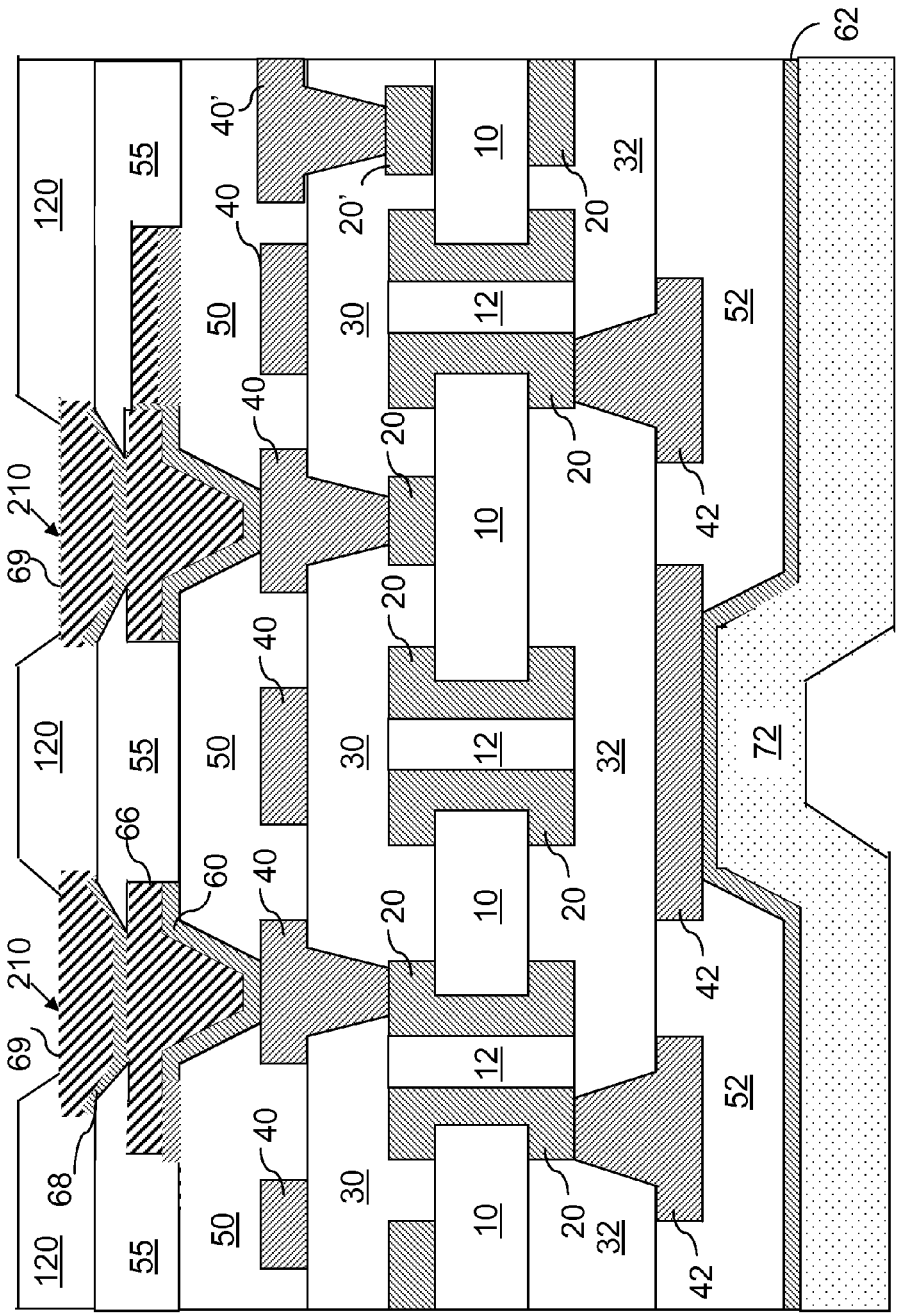

Turning to FIG. 19, a first solder mask 120 is formed over portions of at least one C4 pad 210 and dielectric layer 55. First solder mask 120 may be formed of any conventional solder mask material known in the art, for example, a photosensitive polyimide. As shown, C4 pad 210 is formed entirely of copper (electroless and electrolytic), and includes an exposed portion that does not extend beyond an outermost surface of first solder mask 120.

Figure 20:
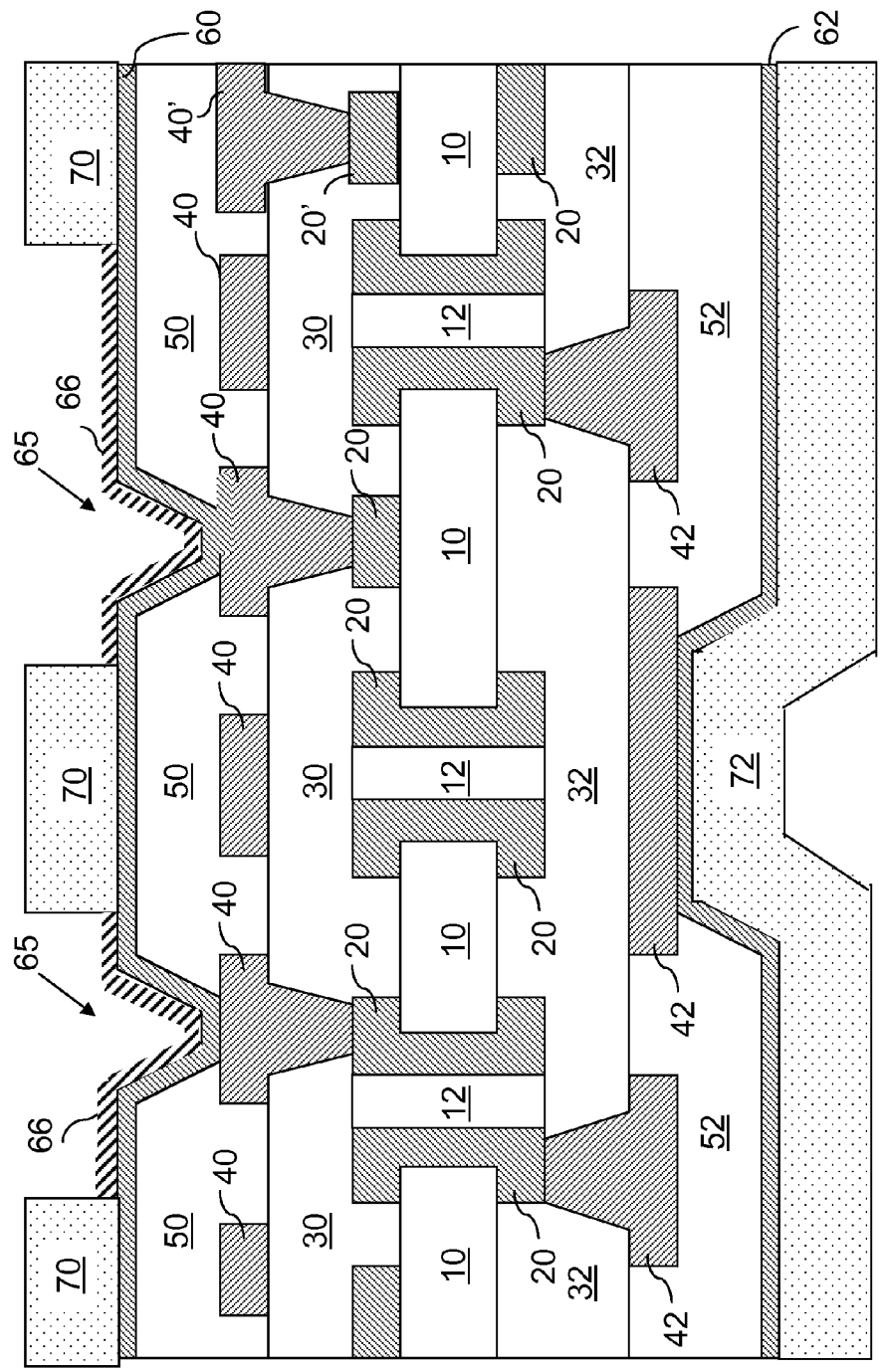
FIGS. 20-23 show cross-sectional views of steps in forming a packaging substrate according to another embodiment of the invention.

Turning to FIG. 20, another alternative embodiment is shown which is substantially similar to the structure of FIG.

12, however, in this embodiment, a third Cu layer 66 is electrolytically plated over Cu layer 60 using a conformal plating technique. Third Cu layer 66 may follow the contours of underlying Cu layer 60, and may not fill the dimple 65 as deposition with a via fill bath would. As is shown and described with reference to FIG. 12, first photoresist 70 covers a portion of Cu layer 60, while third Cu layer 66 covers portions of Cu layer 60 not covered by first photoresist 70. First photoresist 70 may allow for subsequent formation of a narrow copper C4 pad (not shown).

Figure 21:
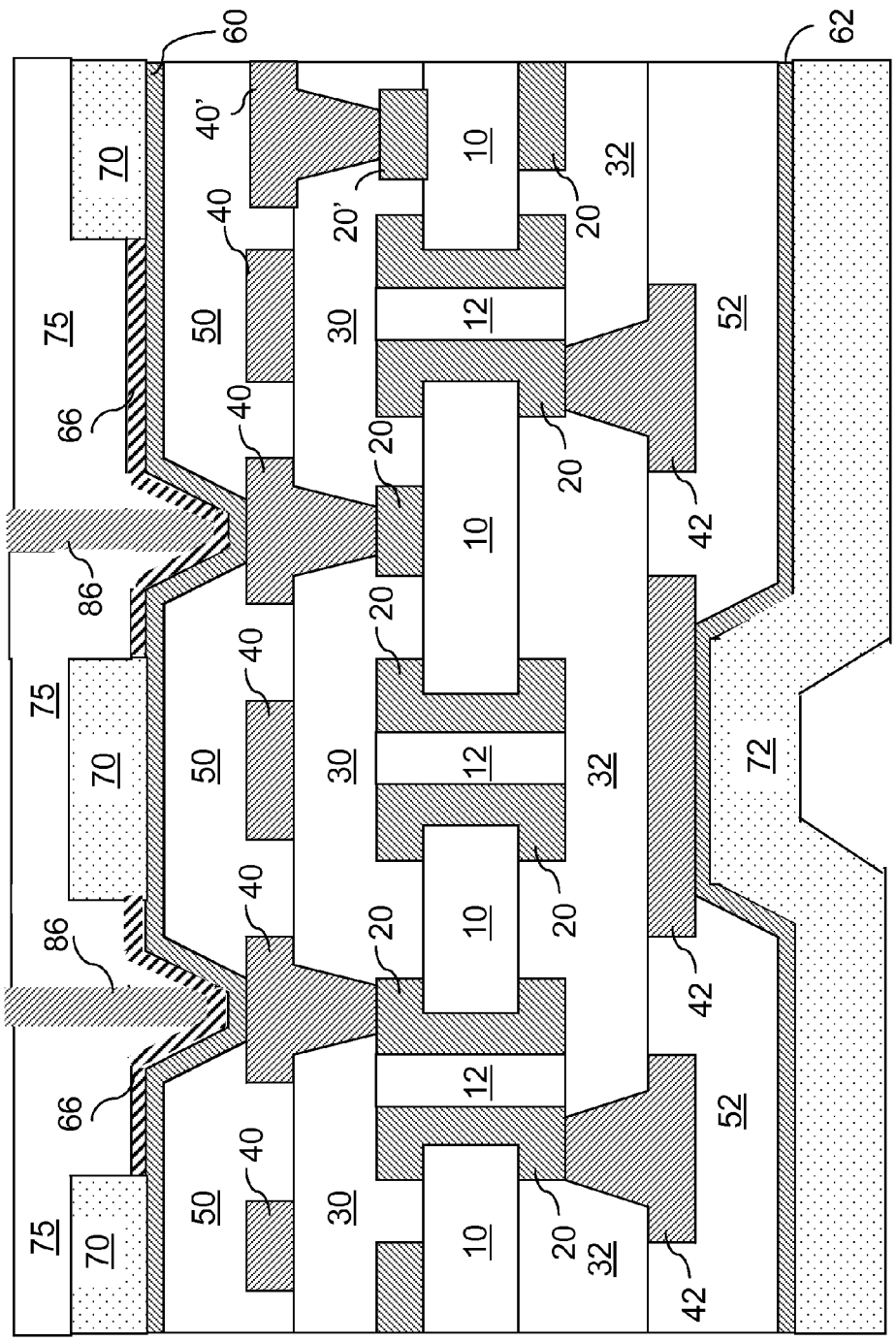
Figure 22:
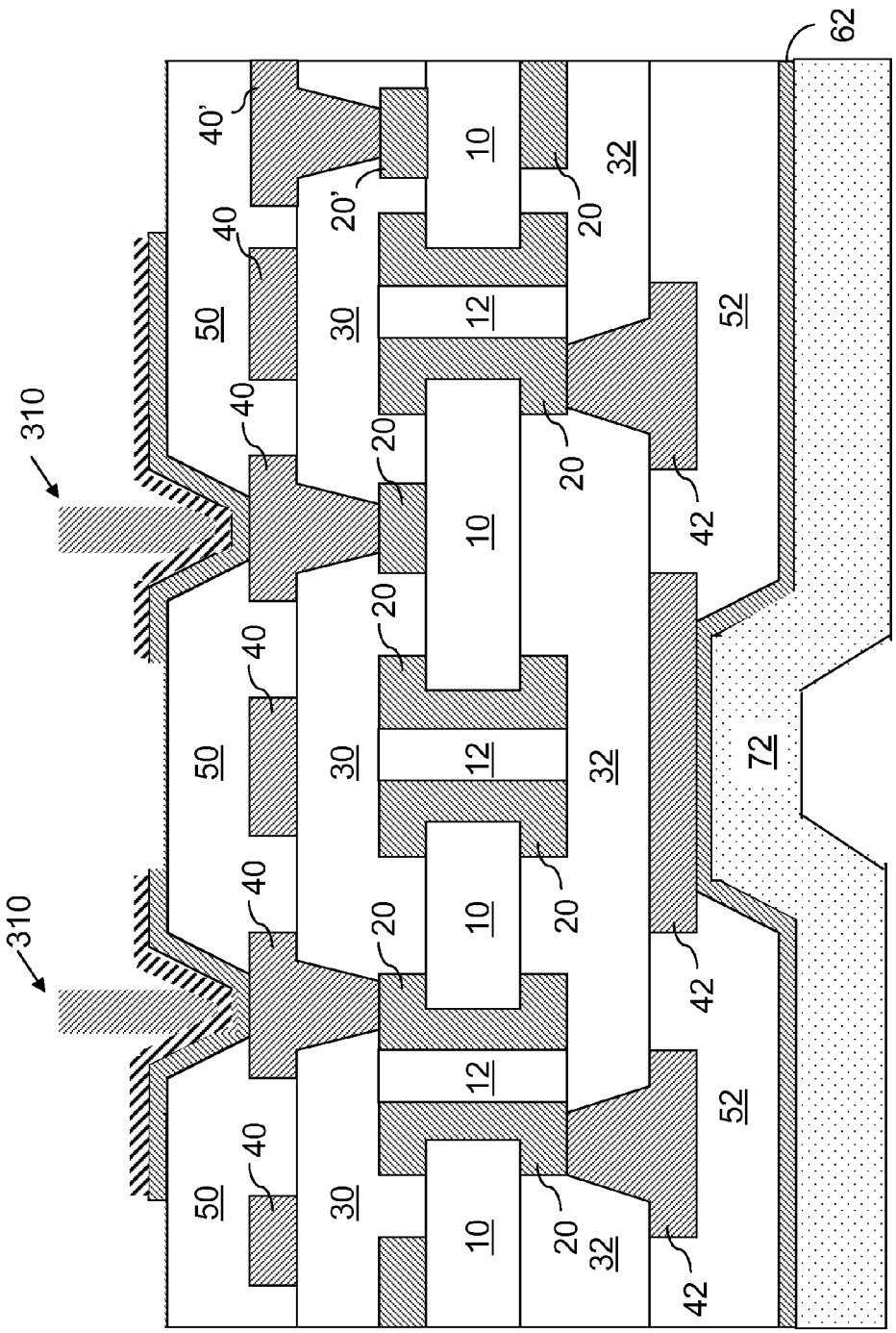

Turning to FIG. 21, a second photoresist 75 is shown formed over first photoresist 70, and portions of third Cu layer 66. Second photoresist 75 may be formed of any photoresist material described herein and/or known in the art. Second photoresist 75 may, for example, be selectively applied over portions of first photoresist 70 and third Cu layer 66. Also shown in FIG. 22 is a fourth Cu layer 86, formed over portions of third Cu layer 66 not covered by first photoresist 70 and second photoresist 75. In one embodiment, first photoresist 70 and second photoresist 75 may leave only portions of third Cu layer 66 exposed at the base of dimple 65 (FIG. 20). This may allow for forming of a vertical contact that extends from a base portion of dimple 65. Fourth Cu layer 86 may be, for example, an electrolessly plated copper layer, which may be applied by electroless plating over exposed portions of third Cu layer 66 at the base of dimple 65.

FIG. 22 shows removal of first photoresist 70 and second photoresist 75 to form a narrow copper C4 pad 310. In one embodiment, C4 pad may be formed substantially of electrolessly plated copper. Removal of second photoresist 75 and first photoresist 70 may be performed in a substantially similar step (e.g., via selective etching), or may be performed in a series of selective steps. Removal of second photoresist 75 and first photoresist 70 may be performed in any manner described herein and/or known in the art. In any case, C4 pad 310 may be formed to include a vertical pillar-shaped structure extending away from Cu layer 60.

Figure 23:
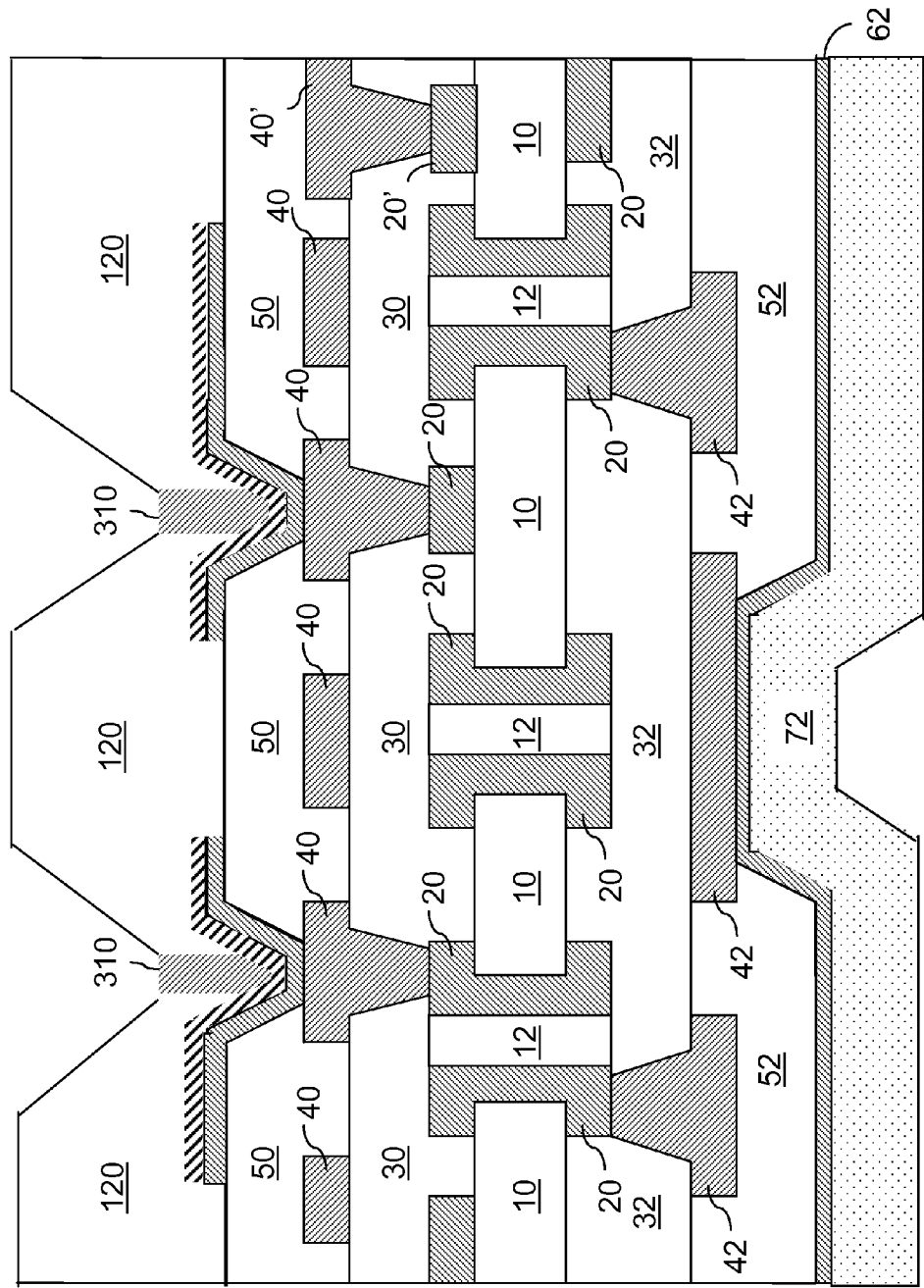

FIG. 23 shows a first solder mask 120 formed over portions of at least one C4 pad 310. First solder mask 120 may be formed of any conventional solder mask material known in the art, including for example, a photosensitive polyimide. As is shown, a portion of first solder mask 120 may be formed between a portion of the fourth Cu layer 86 (FIG. 22) and third Cu layer 66 (FIG. 22). This may be due to the conformal plating of third Cu layer 66, which does not completely fill dimple 65. As shown, C4 pad 310 may be formed substantially of copper, and includes an exposed portion that does not extend beyond an outermost surface of first solder mask 120. C4 pad 310 may force current to enter the narrow C4 pad 310 from its base (e.g., where it contacts interconnect component 40). This may allow for improved current spreading before contact with a C4 ball (not shown).

The methods and structures as described above are used in the fabrication of semiconductor chips. The resulting semiconductor chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks describing the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A packaging substrate comprising:
    a substrate base having a first surface and a second surface;
    a controlled collapse chip connect (C4) pad over a portion of the first surface, the C4 pad including:
        an electrolessly plated copper (Cu) layer over the first surface;
        an electrolytic nickel (Ni) portion over and contacting the electrolessly plated copper (Cu) layer; and
        a first electrolytic Cu portion over and contacting the electrolytic Ni portion;
    wherein the electrolessly plated Cu layer has a portion extending in one direction away from the C4 pad; and
    a first solder mask abutting the first surface of the substrate base, the C4 pad and the portion of the electrolessly plated Cu layer extending in one direction away from the C4 pad, wherein the first solder mask includes a photosensitive polyimide.

2. The packaging substrate of claim 1, wherein the first electrolytic Cu portion and the electrolessly plated Cu portion are each at least 2 micrometers thick.

3. The packaging substrate of claim 1, wherein the C4 pad is at least 14 micrometers thick.

4. The packaging substrate of claim 1, wherein the electrolytic Ni portion is at least 30 micrometers thick.

5. The packaging substrate of claim 1, wherein the C4 pad is at least 34 micrometers thick.

6. The packaging substrate of claim 1, wherein the first solder mask covers a portion of the first surface of the substrate base and at least one sidewall of the C4 pad.

7. The packaging substrate of claim 1, further comprising a second C4 pad including:
   an electrolessly plated copper (Cu) layer over the first surface;
   an electrolytic nickel (Ni) portion over the first electrolytic Cu portion; and
   a first electrolytic Cu portion over the electrolytic Ni portion;
   wherein the electrolessly plated Cu layer has a portion extending in one direction away from the second C4 pad, the portion extending in a substantially opposite direction as the portion of the electrolessly plated Cu layer extending away from the first C4 pad.

8. The packaging substrate of claim 1, wherein the C4 pad further comprises a second electrolytic Cu portion located over the electrolessly plated Cu portion and below the electrolytic Ni portion, the second electrolytic Cu portion extending away from the C4 pad in the same direction as the electrolessly plated Cu portion.

9. A packaging substrate comprising:
   a core having a first surface and a second surface;
   a first metal interconnect layer over the first surface of the core, the first metal interconnect layer including a first interconnect component and a first insulator material;
   a second metal interconnect layer over the second surface of the core, the second metal interconnect layer including a second interconnect component and a second insulator material;
   a controlled collapse chip connect (C4) pad over a first portion of the first metal interconnect layer, the C4 pad comprising an electrolessly plated copper (Cu) layer and an electrolytic Cu layer directly thereover;
   an extension region including portions of the electrolessly plated CU layer and the electrolytic Cu layer, the extension region extending in only one direction away from the C4 pad; and
   a solder mask over a second portion of the first metal interconnect layer, the solder mask abutting a sidewall of the C4 pad,
   wherein the solder mask directly contacts the extension region including the portions of the electrolessly plated CU layer and the electrolytic Cu layer.

10. The packaging substrate of claim 9, wherein a portion of the electrolytic Cu layer not included in the extension region extends away from the first metal interconnect layer and the first surface of the core.

11. The packaging substrate of claim 10, wherein the portion of the electrolytic Cu layer not included in the extension region includes a tapered via.

12. A method of forming a packaging substrate, the method comprising:
   forming a core;
   forming a first metal interconnect layer over the first surface of the core, the first metal interconnect layer including a first interconnect component and an insulator material;
   forming a second metal interconnect layer over the second surface of the core, the second metal interconnect layer including a second interconnect component and the insulator material;
   forming a controlled collapse chip connect (C4) pad over the first metal interconnect layer;
   forming an extension layer over the first metal interconnect layer extending away from the C4 pad; and
   forming a solder mask over a portion of the C4 pad.

13. The method of claim 12, wherein the forming of the C4 pad includes:
   electrolessly plating a first copper (Cu) layer and the extension layer over the first metal interconnect layer;
   depositing and patterning a photoresist over portions of the first Cu layer;
   electrolytically plating a second Cu layer over the first Cu layer and the extension layer;
   depositing and patterning a second photoresist over portions of the first photoresist and the second Cu layer;
   electrolytically plating a nickel (Ni) layer over exposed portions of the second Cu layer;
   electrolytically plating a third Cu layer over the Ni layer; and
   removing the patterned photoresist to form an opening abutting the first metal interconnect layer.

14. The method of claim 12, wherein the forming of the C4 pad includes:
   electrolessly plating a first copper (Cu) layer over the first metal interconnect layer;
   depositing and patterning a photoresist over portions of the first Cu layer;
   electrolytically plating a second Cu layer over portions of the first Cu layer not covered by the photoresist;
   electrolytically plating a nickel (Ni) layer over the second Cu layer;
   electrolytically plating a third Cu layer over the Ni layer; and
   removing the patterned photoresist to form an opening abutting the first metal interconnect layer.

15. The method of claim 12, wherein the forming of the C4 pad includes:
   depositing and patterning a photoresist over portions of the first metal interconnect layer;
   electrolytically plating a copper (Cu) layer over portions of the first metal interconnect layer not covered by the photoresist;
   depositing a second photoresist over the electrolytic Cu layer and the first photoresist;
   patterning the second photoresist to expose portions of the electrolytic Cu layer;
   forming an electroless Cu layer over the exposed portions of the electrolytic Cu layer; and
   removing the first photoresist and the second photoresist.

16. The method of claim 15, wherein the forming of the solder mask includes forming a portion of the solder mask between a portion of the electrolytic Cu layer and the electroless Cu layer.

17. The method of claim 15, wherein the electrolytic Cu layer includes a substantially tapered via.

18. The method of claim 12, wherein the electroless Cu layer includes a substantially vertical pillar, further including:
   forming a solder mask including a photosensitive polyimide over portions of the vertical pillar, wherein the substantially vertical pillar includes an exposed portion that does not extend beyond an outermost surface of the solder mask.

19. The packaging substrate of claim 9, wherein the solder mask covers an entirety of the extension region.

20. The method of claim 12, wherein the solder mask includes a photosensitive polyimide.

* * * * *